United States Patent
Fukushima

(10) Patent No.: US 12,158,485 B2
(45) Date of Patent: Dec. 3, 2024

(54) ESTIMATION APPARATUS, BATTERY, VEHICLE, AND ESTIMATION METHOD

(71) Applicant: GS Yuasa International Ltd., Kyoto (JP)

(72) Inventor: Atsushi Fukushima, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 865 days.

(21) Appl. No.: 17/262,613

(22) PCT Filed: Jun. 26, 2019

(86) PCT No.: PCT/JP2019/025297
§ 371 (c)(1),
(2) Date: Jan. 22, 2021

(87) PCT Pub. No.: WO2020/021944
PCT Pub. Date: Jan. 30, 2020

(65) Prior Publication Data
US 2021/0263086 A1    Aug. 26, 2021

(30) Foreign Application Priority Data
Jul. 25, 2018    (JP) .................................. 2018-139508

(51) Int. Cl.
*G01R 27/08*    (2006.01)
*G01R 31/36*    (2020.01)
(Continued)

(52) U.S. Cl.
CPC ......... *G01R 27/08* (2013.01); *G01R 31/3647* (2019.01); *G01R 31/389* (2019.01);
(Continued)

(58) Field of Classification Search
USPC ..................... 320/104, 106, 107, 108, 109
See application file for complete search history.

(56) References Cited

U.S. PATENT DOCUMENTS

| 4,888,716 A | 12/1989 | Ueno | |
|---|---|---|---|
| 2003/0040944 A1* | 2/2003 | Hileman | G06Q 10/08 705/5 |

(Continued)

FOREIGN PATENT DOCUMENTS

| CN | 101871396 A | * 10/2010 | ............. F02D 29/06 |
|---|---|---|---|
| JP | H06-50340 B2 | 6/1994 | |

(Continued)

OTHER PUBLICATIONS

International Search Report (ISR) (PCT Form PCT/ISA/210), in PCT/JP2019/025297, dated Sep. 10, 2019.

*Primary Examiner* — Brian Ngo
(74) *Attorney, Agent, or Firm* — MCGINN I.P. LAW GROUP, PLLC

(57) ABSTRACT

An estimation apparatus for estimating internal resistance of an engine starting battery includes a processor that executes first estimation processing for estimating the internal resistance of the battery by a first estimation method based on a current change and a voltage change of the battery at the time of cranking by an engine starting apparatus, and second estimation processing for estimating the internal resistance of the battery by a second estimation method different from the first estimation method for a period from the cranking by the engine starting apparatus to the next cranking.

19 Claims, 19 Drawing Sheets

(51) Int. Cl.
*G01R 31/389* (2019.01)
*H01M 10/48* (2006.01)
*B60K 6/26* (2007.10)
*B60W 20/13* (2016.01)
*G01R 31/367* (2019.01)
*H01M 10/42* (2006.01)

(52) U.S. Cl.
CPC ....... *H01M 10/48* (2013.01); *B60K 2006/268* (2013.01); *B60W 20/13* (2016.01); *G01R 31/367* (2019.01); *H01M 2010/4271* (2013.01)

(56) References Cited

U.S. PATENT DOCUMENTS

| | | |
|---|---|---|
| 2007/0200567 A1 | 8/2007 | Mizuno et al. |
| 2009/0045815 A1 | 2/2009 | Zhang et al. |
| 2009/0115419 A1 * | 5/2009 | Ueda ............... G01R 31/3842 324/430 |
| 2010/0224157 A1 | 9/2010 | Mizuno |
| 2010/0269776 A1 | 10/2010 | Mizuno |
| 2013/0317729 A1 | 11/2013 | Mitsuyama et al. |
| 2015/0002096 A1 | 1/2015 | Suzuki |

FOREIGN PATENT DOCUMENTS

| | | | | |
|---|---|---|---|---|
| JP | 2001-228222 A | | 8/2001 | |
| JP | 3325906 | * | 9/2002 | |
| JP | 2003-129927 A | | 5/2003 | |
| JP | 2007-131179 A | | 5/2007 | |
| JP | 3967043 B2 | * | 8/2007 | ............ B60K 6/485 |
| JP | 2007-223530 A | | 9/2007 | |
| JP | 2010-230654 A | | 10/2010 | |
| JP | 2010-270747 A | | 12/2010 | |
| JP | 2012-132726 A | | 7/2012 | |
| JP | 2012-183950 A | | 9/2012 | |
| JP | 2013-220009 A | | 10/2013 | |
| JP | 2016-6404 A | | 1/2016 | |
| JP | 2016-117413 A | | 6/2016 | |
| JP | 2018-037332 A | | 3/2018 | |
| KR | 2015-0040599 A | | 4/2015 | |
| WO | WO-2012026183 A1 | * | 3/2012 | ............ F02D 29/02 |
| WO | WO-2012121272 A1 | * | 9/2012 | ............ B60R 16/03 |

* cited by examiner

Fig. 15

| Time lapse condition | | Decrease amount Y [Ah] | Total decrease amount ΣY [Ah] | Total decrease amount range |
|---|---|---|---|---|
| Period [month] | Temperature [°C] | | | |
| 0 | -- | -- | 0.00 | E1(0~3Ah) |
| 1 | 0 | 0.5241 | 0.5241 | E1(0~3Ah) |
| 2 | 25 | 2.3623 | 2.8864 | E1(0~3Ah) |
| 3 | 25 | 2.3623 | 5.2487 | E2(3~6Ah) |
| 4 | 25 | 0.7874 | 6.0361 | E3(6~9Ah) |
| 5 | 50 | 1.6869 | 7.7230 | E3(6~9Ah) | though

ESTIMATION APPARATUS, BATTERY, VEHICLE, AND ESTIMATION METHOD

TECHNICAL FIELD

The present invention relates to a technique for estimating the internal resistance of a battery.

BACKGROUND ART

Patent Document 1 below discloses a technique for estimating the internal resistance of an engine starting battery. In Patent Document 1, at the time of cranking an engine with a starter motor, the voltage and current of the battery are measured, and the internal resistance is estimated from the measured voltage and current.

PRIOR ART DOCUMENT

Patent Document

Patent Document 1: JP-A-2016-117413

SUMMARY OF THE INVENTION

Problems to be Solved by the Invention

In the above method, the internal resistance is estimated by measuring the voltage and current of the battery at the time of cranking, and hence it is not possible to estimate the internal resistance during a period from the cranking to the next cranking. In a vehicle having an engine and a drive motor such as a hybrid vehicle, for example, the frequency of starting the engine by the starter motor may be low. When the frequency of starting the engine by the starter motor is low, a period in which the internal resistance is not estimated becomes long, and hence the estimation accuracy of the internal resistance may decrease.

The present invention has been made in view of the above circumstances, and it is an object of the present invention to enhance the estimation accuracy of the internal resistance of a battery.

Means for Solving the Problems

An estimation apparatus, which estimates internal resistance of an engine starting battery, includes a processor that executes first estimation processing for estimating the internal resistance of the battery by a first estimation method based on a current change and a voltage change of the battery during cranking by an engine starting apparatus, and second estimation processing for estimating the internal resistance of the battery by a second estimation method different from the first estimation method in a period from the cranking by the engine starting apparatus to the next cranking. This technique can be applied to a battery mounted with an estimation apparatus and a hybrid vehicle mounted with the battery. This technique can also be applied to a method for estimating internal resistance.

Advantages of the Invention

The estimation accuracy of the internal resistance of the battery can be improved.

BRIEF DESCRIPTION OF THE DRAWINGS

FIG. 15 is a diagram showing an example of estimation of the total decrease amount of the actual capacity of the secondary battery.

MODE FOR CARRYING OUT THE INVENTION

Figure 1:
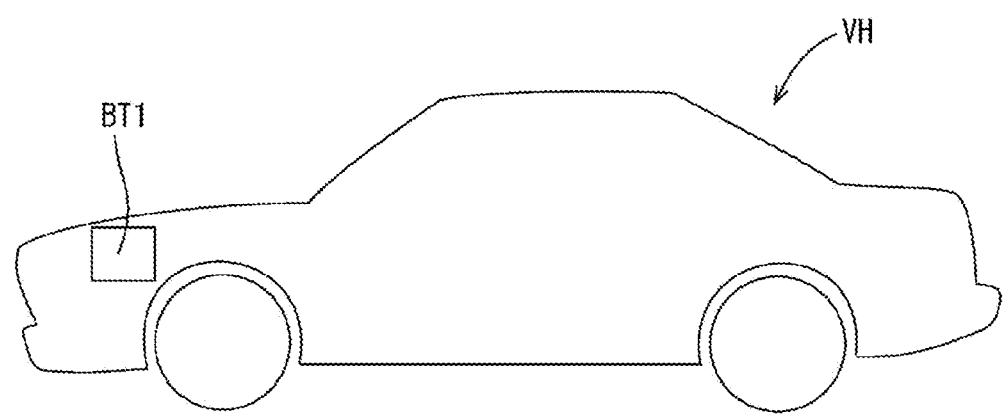
FIG. 1 is a side view of a vehicle.

An estimation apparatus, which estimates internal resistance of an engine starting battery, includes a processor that executes first estimation processing for estimating the internal resistance of the battery by a first estimation method based on a current change and a voltage change of the battery during cranking by an engine starting apparatus, and second estimation processing for estimating the internal resistance of the battery by a second estimation method different from the first estimation method for a period from the cranking by the engine starting apparatus to the next cranking.

The period from the cranking by the engine starting apparatus to the next cranking is an estimation-impossible period in which internal resistance R cannot be estimated by the first estimation method. The processor estimates the internal resistance by the second estimation method in the period from the cranking to the next cranking, which is the estimation-impossible period. Thus, the estimation-impossible period for the internal resistance is eliminated, and the estimation accuracy of the internal resistance is high. This is particularly effective when the frequency of cranking by the engine starting apparatus is low and the estimation-impossible period for the estimation by the first estimation method is long.

The processor may include a storage part storing an initial value of the internal resistance, and when estimating the internal resistance by the first estimation method within a predetermined period after the manufacturing of the battery, the processor may rewrite the initial value of the internal resistance from the stored value to the estimated value obtained by the first estimation method. In this manner, the error of the initial value can be reduced.

The second estimation method may be a method for estimating the internal resistance of the battery on the basis of information correlated with a resistance increase rate of the internal resistance. The internal resistance can be estimated from information correlated with the resistance increase rate, such as information of the capacity decrease rate and temperature of the energy storage device, even at a time other than the time of cranking when current and voltage largely changes.

In the second estimation method, the processor may obtain, from the resistance increase rate, an amount of increase in resistance from the internal resistance estimated by the first estimation method at the time of cranking by the engine starting apparatus to estimate the internal resistance in a period until the next cranking. With the first estimation method having the high estimation accuracy of the internal resistance, the estimation error of the internal resistance at the start point of estimation by the second estimation method is small. Hence, the internal resistance can be estimated with high accuracy by the second estimation method in the period until the next cranking.

In the second estimation method, when the internal resistance estimated by the first estimation method is not included in a fluctuation range at the time of cranking by the engine starting apparatus, the processor may limit the internal resistance estimated by the first estimation method within the fluctuation range. When the internal resistance, which generally makes no sudden change, has abnormally increased or decreased as a result of the estimation by the first estimation method, the increase or decrease is likely to be an estimation error of the internal resistance by the first estimation method. When the cranking is frequently performed, the influence of the estimation error can be reduced by using the average value of several times. However, when the frequency of cranking is low, it is difficult to use the average value of several times. In this method, even when the frequency of cranking is low, and the average value processing for estimation results cannot be performed, it is possible to prevent the estimated value of the internal resistance from fluctuating abnormally.

When the internal resistance estimated by the first estimation method is larger than an upper limit value of the fluctuation range, the processor may obtain an amount of increase in resistance from the upper limit value of the fluctuation range to estimate the internal resistance in a period until the next cranking, and when the internal resistance estimated by the first estimation method is smaller than a lower limit value of the fluctuation range, the processor may obtain an amount of increase in resistance from the lower limit value of the fluctuation range to estimate the internal resistance in the period until the next cranking. When the internal resistance estimated by the first estimation method is larger than the upper limit value of the fluctuation range, the actual internal resistance is likely to be closer to the upper limit value than the lower limit value of the fluctuation range. On the contrary, when the internal resistance estimated by the first estimation method is smaller than the lower limit value of the fluctuation range, the actual internal resistance is likely to be closer to the lower limit value than the upper limit value of the fluctuation range. In this method, the internal resistance is estimated by selecting a value expected to be closer to the actual internal resistance out of the upper limit value and the lower limit value of the fluctuation range, so that the estimation accuracy of the internal resistance is high.

The fluctuation range may be larger as the period from the cranking by the engine starting apparatus to the next cranking is longer. In this manner, the fluctuation range can be set in accordance with accumulation of estimation errors by the second estimation method. It is thus possible to accurately determine whether or not the estimated value of the internal resistance obtained by the first estimation method is a good value.

The present technique is applicable to an engine starting battery. The present technique is applicable to a hybrid vehicle provided with a drive motor, an engine, an engine starting apparatus, and an engine starting battery. The hybrid vehicle may include an electric vehicle (EV) priority button that controls the operation of the engine starting apparatus and prioritizes an EV traveling mode.

First Embodiment

1. Description of Structure of Engine Starting Low-Voltage Battery BT1

Figure 2:
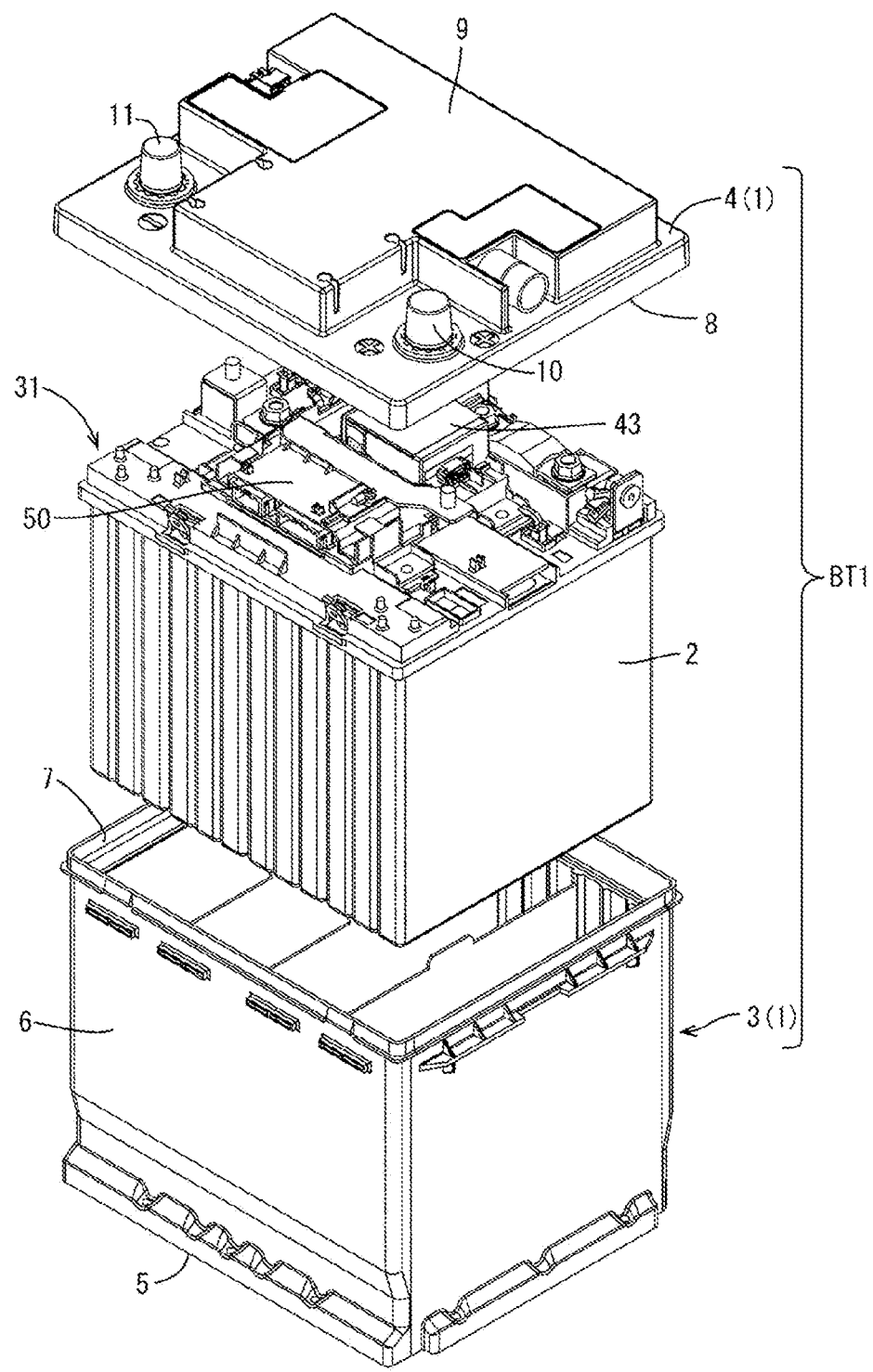
FIG. 2 is an exploded perspective view of an engine starting battery.

FIG. 1 is a side view of a vehicle VH, and FIG. 2 is an exploded perspective view of an engine starting battery BT1. The vehicle VH is provided with the engine starting low-voltage battery BT1 which is an energy storage apparatus. As shown in FIG. 2, the engine starting low-voltage battery BT1 includes a housing 1, a plurality of secondary batteries 2 housed inside the housing 1, and a circuit board unit 31.

The housing 1 includes a main body 3 made of a synthetic resin material and a lid 4. The main body 3 has a bottomed tubular shape and includes a bottom surface portion 5 having a rectangular shape in plan view and four side surface portions 6 rising from four sides thereof to form a tubular shape. An upper opening 7 is formed in an upper-end portion by the four side surface portions 6.

The lid 4 has a rectangular shape in plan view, and a frame body 8 extends downward from four sides thereof. The lid 4 closes the upper opening 7 of the main body 3. The lid 4 has, on the upper surface, a protrusion 9 having a substantially T-shape in plan view. An external terminal 10 of the positive electrode is fixed to one corner of two locations where the protrusion 9 is not formed on the upper surface of the lid 4, and an external terminal 11 of the negative electrode is fixed to the other corner portion. The housing 1 houses the secondary battery 2 and the circuit board unit 31. The circuit board unit 31 is on the upper portion of the secondary battery 2.

Figure 3A:
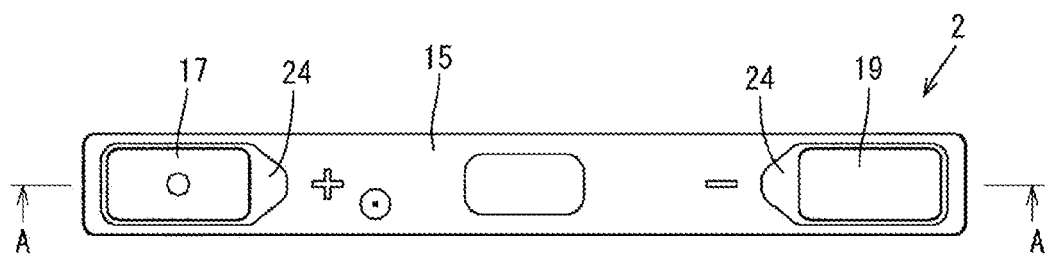
FIG. 3A is a plan view of a secondary battery shown in FIG. 2.
Figure 3B:
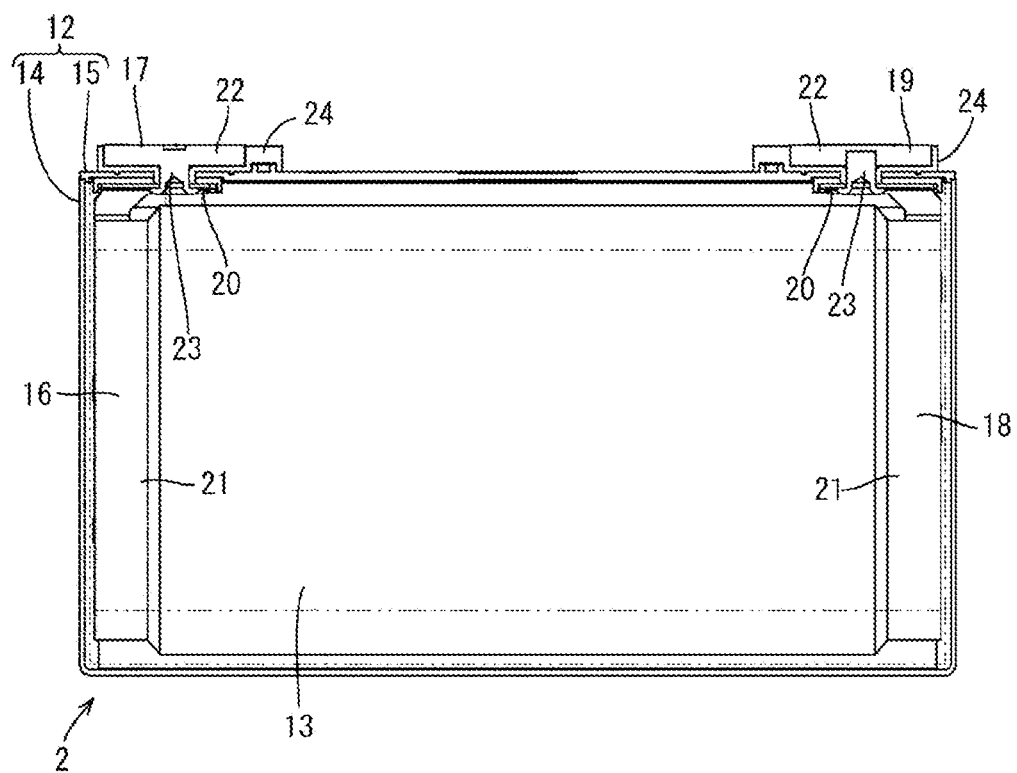
FIG. 3B is a cross-sectional view taken along line A-A of FIG. 3A.

As shown in FIGS. 3A and 3B, the secondary battery 2 is one in which an electrode assembly 13 is housed in a rectangular parallelepiped case 12 together with a nonaqueous electrolyte. The case 12 has a case body 14 and a cover 15 that closes an opening at the top of the case body 14.

Although not shown in detail, the electrode assembly 13 has a separator, made of a porous resin film, disposed between a negative electrode element formed by applying an active material to a substrate made of copper foil and a positive electrode element formed by applying an active material to a substrate made of aluminum foil. These are all belt-shaped, and are wound in a flat shape so as to be able to be housed in the case body 14 in a state where the negative electrode element and the positive electrode element are displaced from each other on the opposite sides in the width direction with respect to the separator.

The positive electrode element is connected to a positive electrode terminal 17 via a positive electrode current collector 16, and the negative electrode element is connected to a negative electrode terminal 19 via a negative electrode current collector 18. Each of the positive electrode current collector 16 and the negative electrode current collector 18 is made up of a plate-shaped base 20 and legs 21 extending from the base 20. A through hole is formed in the base 20. The leg 21 is connected to the positive electrode element or the negative electrode element. Each of the positive electrode terminal 17 and the negative electrode terminal 19 is made up of a terminal main body portion 22 and a shaft 23 protruding downward from the center portion of the lower surface of the terminal main body portion 22. The terminal main body portion 22 and the shaft 23 of the positive electrode terminal 17 are integrally formed of aluminum (single material). In the negative electrode terminal 19, the terminal main body portion 22 is made of aluminum, the shaft 23 is made of copper, and these are assembled. The terminal main body portions 22 of the positive electrode terminal 17 and the negative electrode terminal 19 are arranged at both ends of the cover 15 via gaskets 24 made of an insulating material and are exposed to the outside from the gaskets 24.

Figure 4:
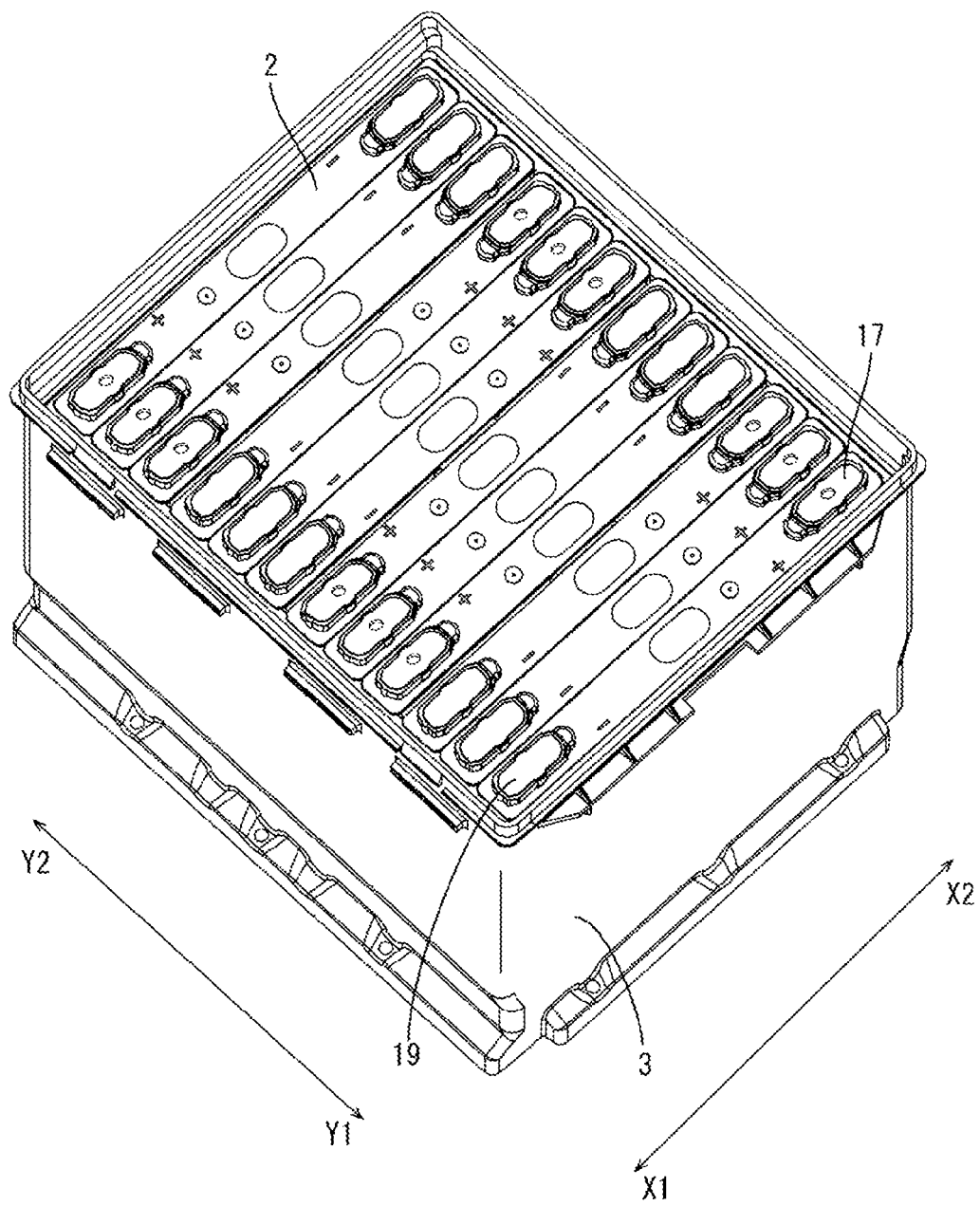
FIG. 4 is a perspective view showing a state in which a secondary battery is housed in the body of FIG. 2.

As shown in FIG. 4, a plurality of (e.g., twelve) secondary batteries 2 having the configuration described above are housed in the main body 3 in a state of being arranged in the width direction. The plurality of secondary batteries 2 are arranged from one end side to the other end side of the main body 3 (direction of arrow Y1 to Y2) with three secondary batteries 2 as one set so that in the same set, the terminal polarities of adjacent secondary batteries 2, 2 are the same, and between adjacent sets, the terminal polarities of adjacent secondary batteries 2 are opposite to each other. In three secondary batteries 2 (first set) located closest to the arrow Y1 side, the arrow X1 side is the negative electrode and the arrow X2 side is the positive electrode. In three secondary batteries 2 (second set) adjacent to the first set, the arrow X1 side is the positive electrode and the arrow X2 side is the negative electrode. In a third set adjacent to the second set, the arrangement is the same as that in the first set, and in the fourth set adjacent to the third set, the arrangement is the same as that in the second set.

Figure 5:
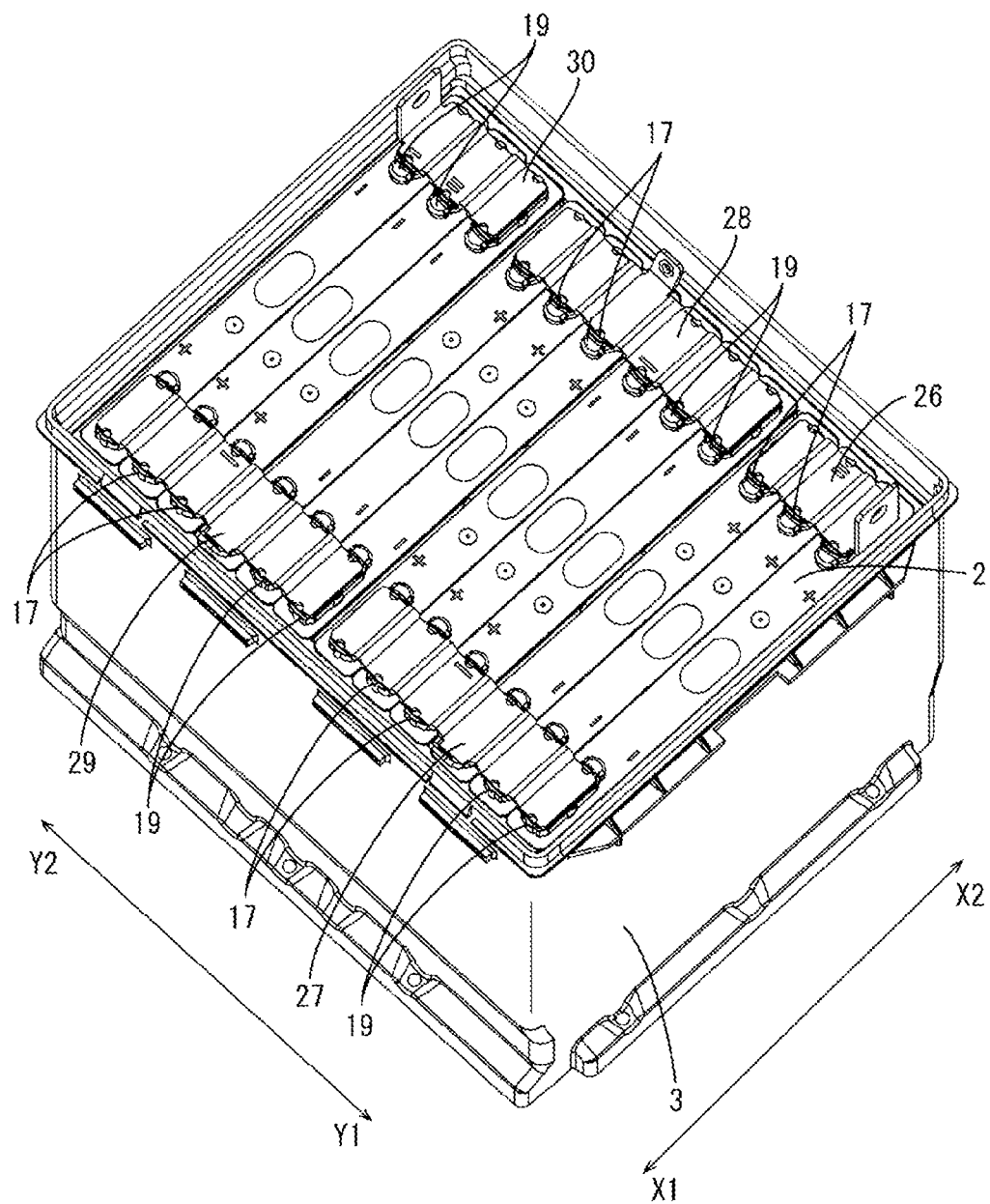
FIG. 5 is a perspective view showing a state in which a bus bar is mounted on the secondary battery of FIG. 4.

As shown in FIG. 5, terminal bus bars (connecting members) 26 to 30 as conductive members are connected to the positive electrode terminal 17 and the negative electrode terminal 19 by welding. On the arrow X2 side of the first set, a group of the positive electrode terminals 17 is connected by the first bus bar 26. Between the first set and the second set, a group of the negative electrode terminals 19 in the first set and a group of the positive electrode terminals 17 in the second set are connected by the second bus bar 27 on the arrow X1 side. Between the second set and the third set, a group of the negative electrode terminals 19 in the second set and a group of the positive electrode terminals 17 in the third set are connected by the third bus bar 28 on the side of the arrow X2. Between the third set and the fourth set, a group of the negative electrode terminals 19 in the third set and a group of the positive electrode terminals 17 in the fourth set are connected by the fourth bus bar 29 on the arrow X1 side. On the arrow X2 side of the fourth set, a group of the negative electrode terminals 19 are connected by the fifth bus bar 30.

The secondary batteries 2 are arranged in parallel in the same set and in series in different sets. Hence, the 12 secondary batteries 2 are arranged in three parallel and four series. The secondary battery 2 is, for example, a lithium ion secondary battery. The first bus bar 26 for connecting the group of the positive electrode terminals in the first set is connected to the positive electrode external terminal 10, and the fifth bus bar 30 for connecting the group of the negative electrode terminals in the fourth set is connected to the negative electrode external terminal 11.

2. Electrical Configuration of Engine Starting Low-Voltage Battery BT1

Figure 6:
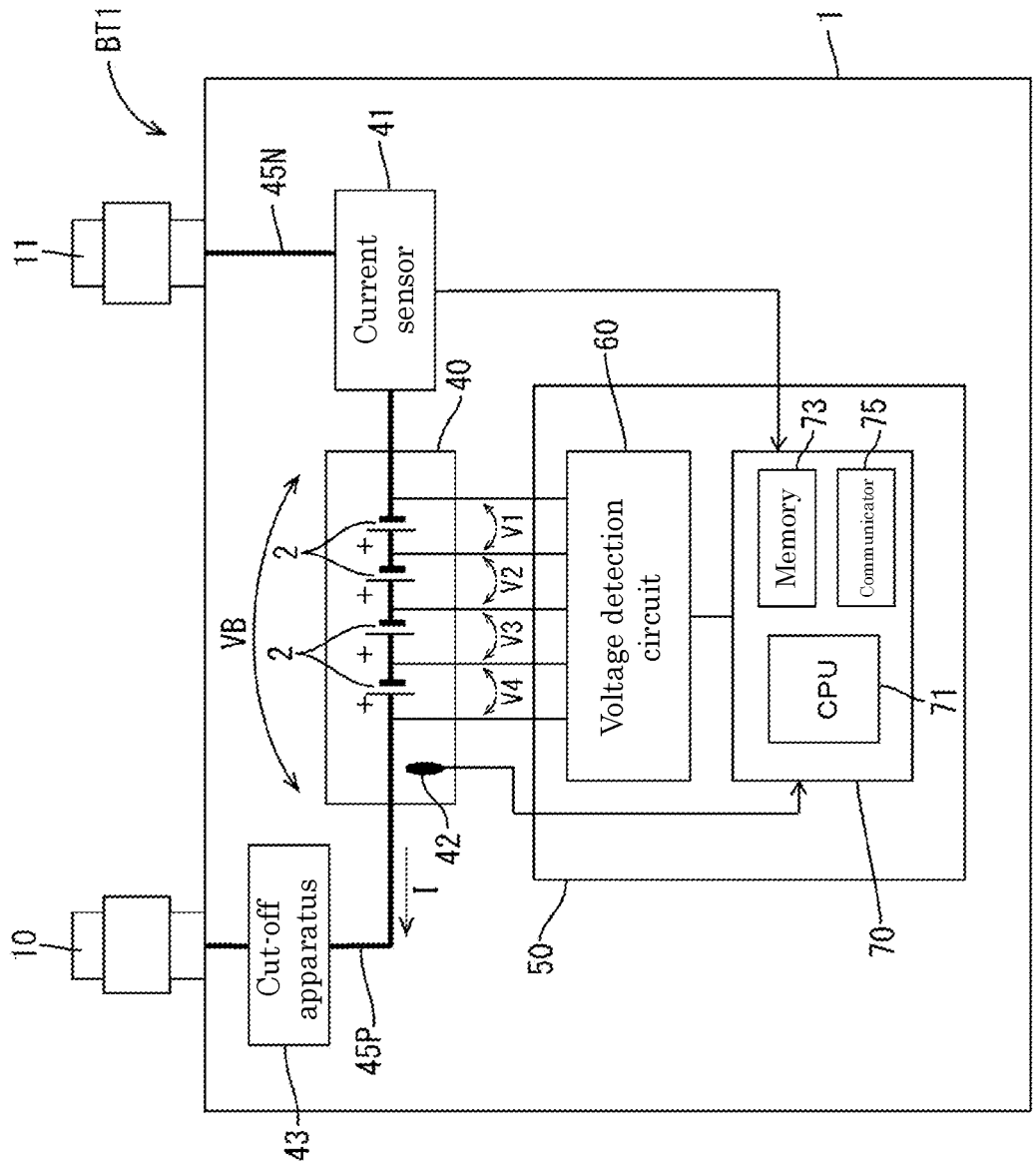
FIG. 6 is a diagram showing a circuit configuration of an engine-starting battery.

FIG. 6 is a block diagram showing the electrical configuration of the engine starting low-voltage battery BT1. The low-voltage battery BT1 includes an assembled battery 40, a current sensor 41, a cut-off apparatus 43, and a management apparatus 50 that manages the assembled battery 40. The assembled battery 40 is made up of 12 secondary batteries 2 connected in series and in parallel. FIG. 6 shows only four secondary batteries 2 in series. The management apparatus 50 is an example of an estimation apparatus, and the secondary battery 2 is an example of an energy storage device.

The current sensor 41, the assembled battery 40, and the cut-off apparatus 43 are connected in series via power lines 45P, 45N. The power line 45P on the positive electrode side is a power line for connecting the external terminal 10 of the positive electrode and the positive electrode of the assembled battery 40. The power line 45N on the negative electrode side is a power line for connecting the external terminal 11 of the negative electrode and the negative electrode of the assembled battery 40.

The cut-off apparatus 43 is located on the positive electrode side of the assembled battery 40 and is provided on the power line 45P of the positive electrode. The current sensor 41 is located on the negative electrode side of the assembled battery 40 and is provided on the power line 45N on the negative electrode side.

The cut-off apparatus 43 can be made of a contact switch (mechanical type) such as a relay, or a semiconductor switch such as a field-effect transistor (FET) or a transistor. A current I can be cut off by operating the cut-off apparatus 43.

The current sensor 41 is provided in the circuit board unit 31. The current sensor 41 measures the current I of the assembled battery 40. A temperature sensor 42 measures the temperature [° C.] of the assembled battery 40 in a contact or non-contact manner.

The current sensor 41 and the temperature sensor 42 are electrically connected to the management apparatus 50 by a signal line. The current sensor 41 and the temperature sensor 42 output measured values to a processor 70 of the management apparatus 50.

The management apparatus 50 is provided in a circuit board unit 31. The management apparatus 50 includes a voltage detection circuit 60 and a processor 70. The voltage detection circuit 60 is connected to both ends of each secondary battery 2 by signal lines and measures battery voltages V1 to V4 of each secondary battery 2 and a total voltage VB of the assembled battery 40. The total voltage VB of the assembled battery 40 is the total voltage of the four secondary batteries 2 connected in series.

$$VB = V1 + V2 + V3 + V4 \quad \text{(Equation 1)}$$

The processor 70 includes a central processing unit (CPU) 71 having an arithmetic function, a memory 73 serving as a storage part, and a communicator 75. The processor 70 is an example of a computer. The processor 70 has a clocking part (not shown) and has time data from the battery manufacturing time and from the vehicle manufacturing time. The processor 70 monitors the current I, the total voltage VB, and the temperature of the assembled battery 40 from the outputs of the current sensor 41, the voltage detection circuit 60, and the temperature sensor 42. The processor 70 performs first estimation processing for estimating the internal resistance R of the assembled battery 40 by a first estimation method and second estimation processing for estimating the internal resistance R of the assembled battery by a second estimation method.

The memory 73 is a non-volatile storage medium such as a flash memory or an electrically erasable programmable read-only memory (EEPROM). The memory 73 stores a monitoring program for monitoring the state of the assembled battery 40 and data necessary for executing the monitoring program. The memory 73 stores an estimation program for estimating the internal resistance R of the assembled battery 40 and various pieces of data for executing the estimation program. The estimation program is a program for estimating the internal resistance R of the assembled battery 40 by causing the processor 70, which is a computer, to execute the first estimation processing and the second estimation processing. The various pieces of data are data indicating a correlation between a capacity decrease rate Xc and a resistance increase rate Zr shown in FIG. 11, data indicating a correlation between elapsed time T and a total decrease amount ΣY shown in FIG. 12, and some other data. The communicator 75 is provided for communication with the vehicle VH.

3. Drive Apparatus 100 of Vehicle VH

Figure 7:
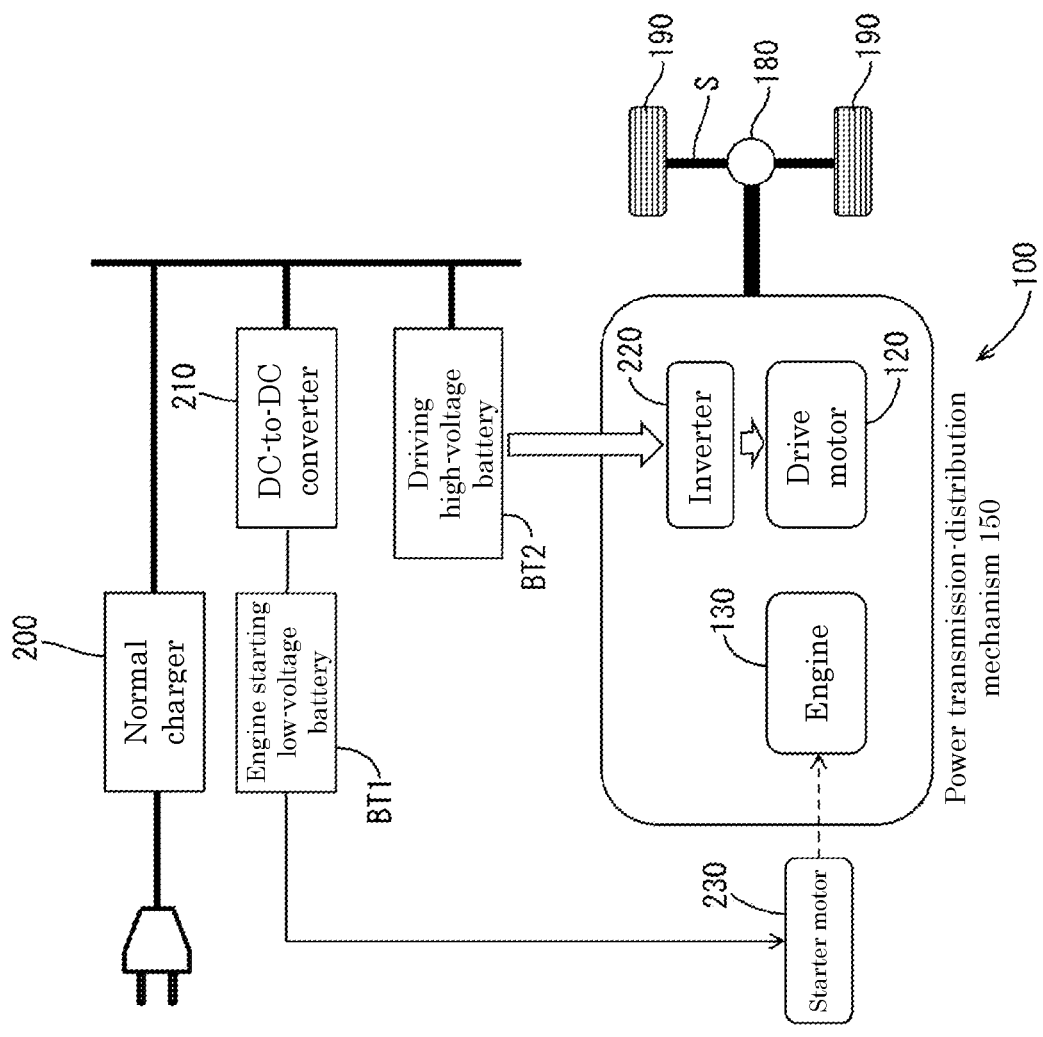
FIG. 7 is a block diagram of a drive system of a vehicle.

The vehicle VH is a plug-in hybrid vehicle. FIG. 7 is a block diagram of a drive apparatus 100 of the plug-in hybrid vehicle VH. The drive apparatus 100 includes a drive motor 120 for driving an axle S having wheels 190 mounted on both sides, an engine 130, and a power transmission-distribution mechanism 150. The power transmission-distribution mechanism 150 is a mechanism for transmitting power to the axle S and distributing power among the apparatuses. The power transmission-distribution mechanism 150 is made up of a transmission, a clutch, a power splitting mechanism (planetary gear), and the like, and there are series type, parallel type, series-parallel type, and the like depending on the connection method of the drive motor 120 and the engine 130.

As shown in FIG. 7, the vehicle VH includes a vehicle-mounted normal charger 200 that can be charged from a commercial power supply, an engine starting low-voltage battery BT1, a driving high-voltage battery BT2, a direct current (DC) to DC converter 210, and a starter motor 230. The driving high voltage battery BT2 can be charged by the vehicle-mounted normal charger 200. The driving high-voltage battery BT2 is connected to the drive motor 120 via an inverter 220. The inverter 220 converts the electric power of the driving high voltage battery BT2 from DC to alternating current (AC) and supplies the converted electric power to the drive motor 120. The driving high-voltage battery BT2 has a higher voltage class than the engine starting low-voltage battery BT1. The voltage class is a class of the output voltage of each of the batteries BT1, BT2.

The engine starting low-voltage battery BT1 is connected to the vehicle-mounted normal charger 200 via a DC-to-DC converter 210. The DC-to-DC converter 210 steps down the output voltage of the vehicle-mounted normal charger 200 and supplies electric power to the engine starting low-voltage battery BT1, thereby charging the engine starting low-voltage battery BT1. The engine starting low-voltage battery BT1 has a voltage class of 12 V and is a power source for the starter motor 230. The engine starting low-voltage battery BT1 may be a power source for vehicle-mounted auxiliary equipment. The starter motor 230 is an engine starting apparatus using the low-voltage battery BT1 as a power source. The starter motor 230 rotates the crankshaft of the engine 130 to start the engine 130.

Figure 8A:
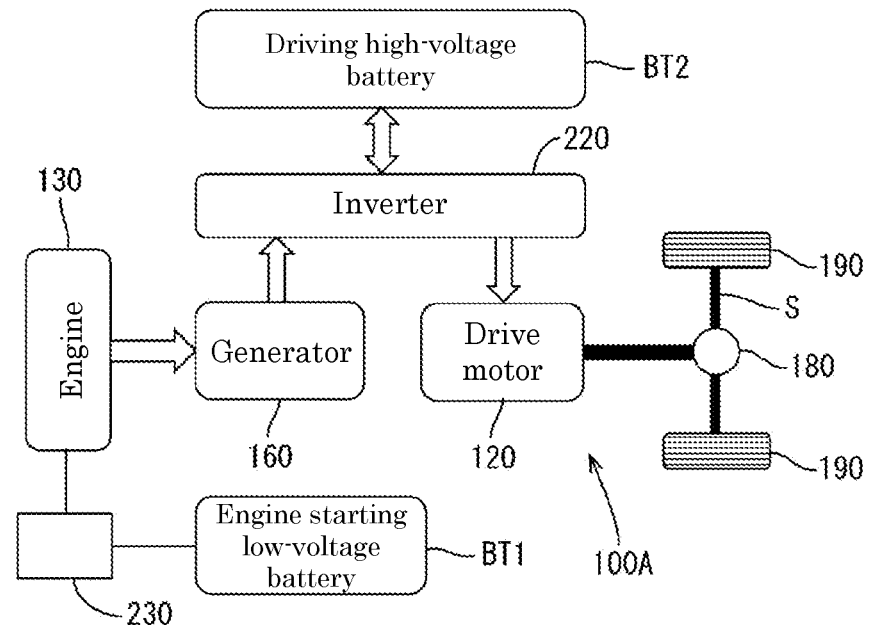
FIG. 8A is a diagram showing a series type drive apparatus.
Figure 8B:
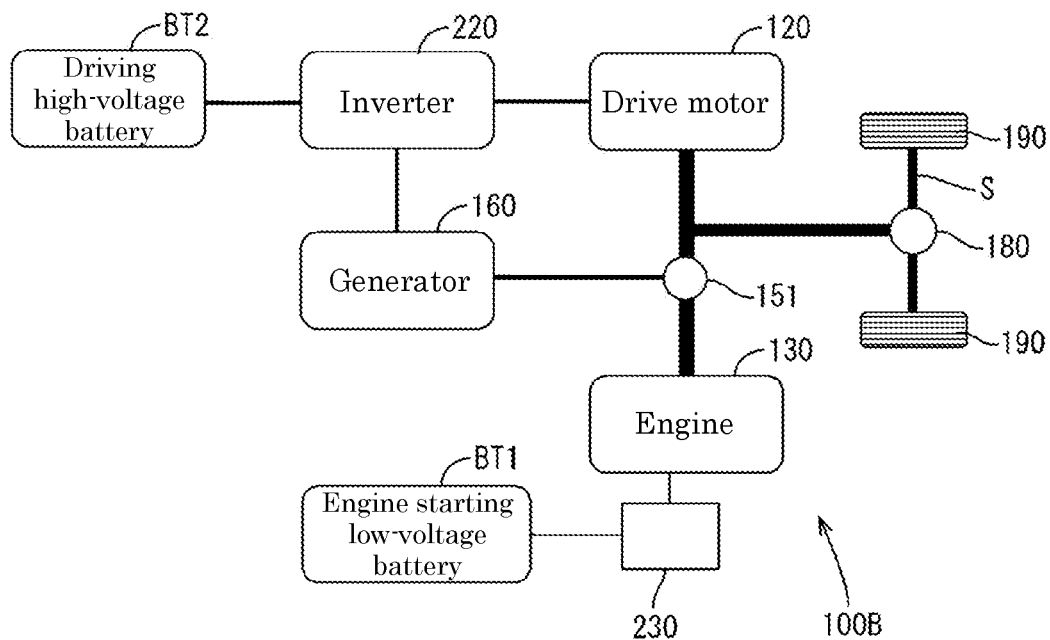
FIG. 8B is a diagram showing a series-parallel type drive apparatus.
Figure 8C:
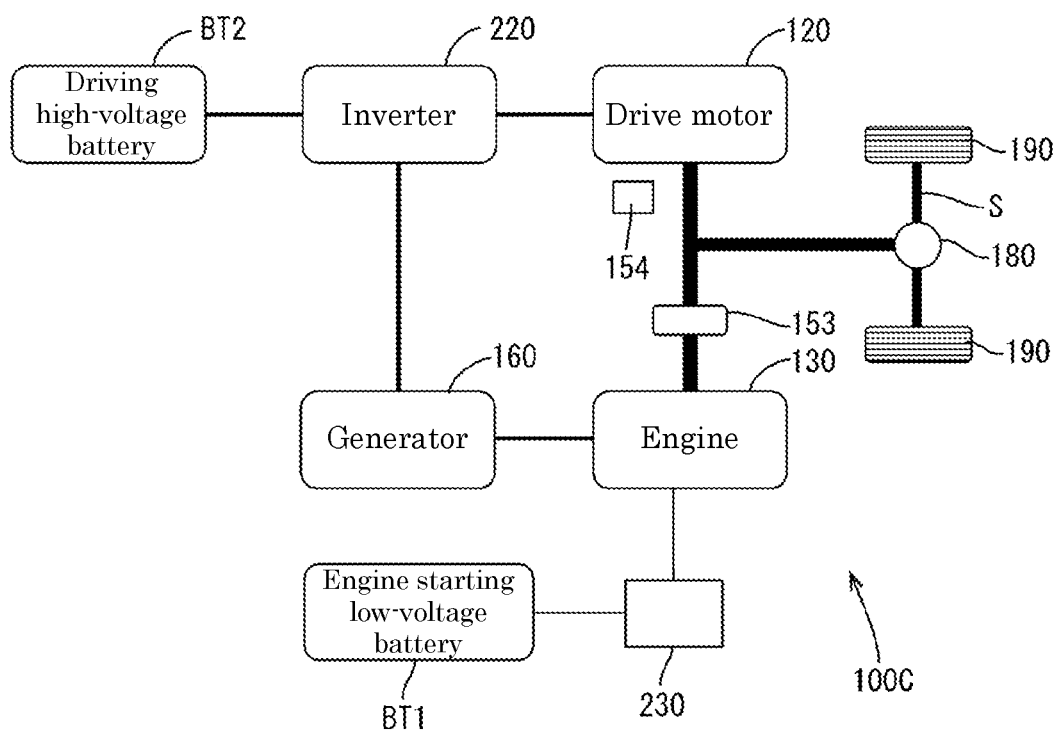
FIG. 8C is a diagram showing a series-parallel type drive apparatus.

FIG. 8A shows a series type drive apparatus 100A. FIGS. 8B and 8C show series-parallel type drive apparatuses 100B, 100C.

In the series type drive apparatus 100A, a drive motor 120 is directly connected to the axle S having the wheels 190 mounted on both sides via a differential 180. The vehicle VH mounted with the series type drive apparatus 100A travels by the power of a drive motor 120. The engine 130 is dedicated to power generation, and by driving the generator 160 by the engine 130, the driving high-voltage battery BT2 can be charged during traveling.

At the time of rapid acceleration, electric power is supplied from the generator 160 in addition to the driving high-voltage battery BT2 to compensate for the torque shortage of the drive motor 120. At the time of deceleration, the driving high-voltage battery BT2 can be charged by the electric power regenerated by the drive motor 120.

In the series-parallel type drive apparatus 100B, the drive motor 120 and the engine 130 are connected in parallel to the axle S via a differential 180. A power dividing mechanism 151 is provided between the drive motor 120 and the engine 130. The generator 160 is connected to the power dividing mechanism 151. The power dividing mechanism 151 is, for example, a planetary gear, which divides the power of the engine 130 and transmits the divided power to the drive motor 120 and the generator 160.

The vehicle VH mounted with the series-parallel type drive apparatus 100B travels by properly using a combination of the engine 130 and the drive motor 120 in accordance with a traveling state. In general, the vehicle VH stops the engine 130 at the time of starting or traveling at a low or medium speed and travels by the power of the drive motor 120 with the driving high-voltage battery BT2 as the power source (EV traveling mode).

At the time of normal traveling, the engine 130 is driven. The power of the engine 130 is divided and transmitted to the generator 160 and the axle S via the power dividing mechanism 151. The drive motor 120 is driven by the generator 160 as a power source, and the vehicle VH travels by two powers of the drive motor 120 and the engine 130. At the time of sudden acceleration, electric power is supplied from the driving high-voltage battery BT2 in addition to the generator 160 to compensate for the insufficient torque of the drive motor 120 (HV traveling mode).

The series-parallel type drive apparatus 100C is different from the drive apparatus 100B in that the drive motor 120 and the engine 130 are connected to each other by a clutch 153, the engine 130 and the generator 160 are directly connected to each other, and an EV priority button 154 is provided.

The vehicle VH mounted with the series-parallel type drive apparatus 100C switches between the EV traveling mode and a hybrid vehicle (HV) traveling mode in accordance with the traveling state and the remaining capacity of the high voltage traveling battery BT2.

The EV traveling mode is a mode in which the vehicle travels only by the power of the drive motor 120. In the EV traveling mode, the clutch 153 is turned off, and the engine 130 is stopped.

The HV traveling mode is a traveling mode in which the drive motor 120 and the engine 130 are used together. The HV traveling mode includes a series traveling mode and a parallel traveling mode. The series traveling mode is a mode in which the clutch 153 is turned off and the engine 130 is used for power generation, and the vehicle travels only by the power of the drive motor 120. In the parallel traveling mode, the clutch 153 is connected, and the vehicle travels only by the power of each of the engine 130 and the drive motor 120.

The EV priority button 154 is a button for reducing the starting of the engine 130 and giving priority to the EV traveling mode. When a user presses the EV priority button, the vehicle electronic control unit (ECU) mounted on the vehicle VH controls the drive apparatus 100C such that the EV traveling mode is given priority over the series traveling mode or the parallel traveling mode. The EV priority button 154 may be provided in the drive apparatus 100A or the drive apparatus 100B.

4. Estimation of Internal Resistance R

A processor 70 of the management apparatus 50 estimates the internal resistance R of the assembled battery 40 by using the first estimation method and the second estimation method.

Figure 9A:
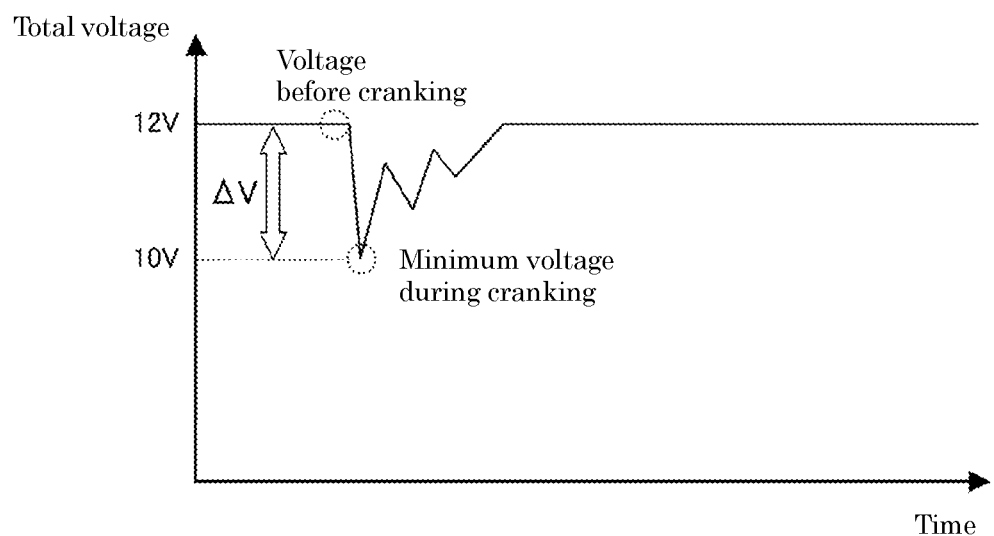
FIG. 9A is a graph showing a voltage waveform at the time of cranking.
Figure 9B:
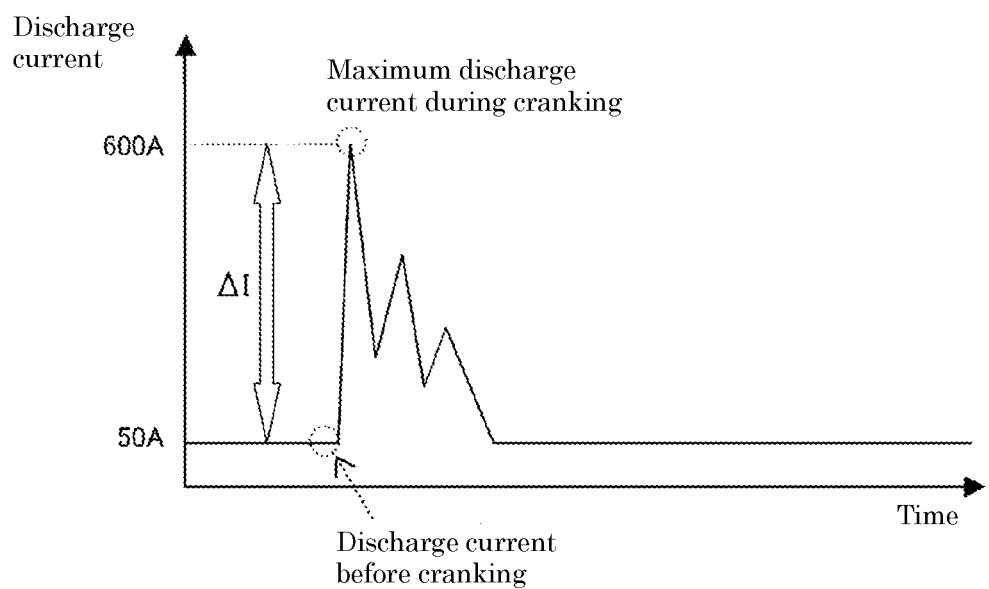
FIG. 9B is a graph showing a current waveform at the time of cranking.

The first estimation method is a method in which the internal resistance R of the assembled battery 40 is estimated on the basis of the measured values of the total voltage VB and the discharge current I of the assembled battery 40 at the time of cranking by the starter motor 230. FIG. 9A shows a change in the total voltage VB of the assembled battery 40 at the time of cranking by the starter motor 230, and FIG. 9B shows a change in the discharge current I at the time of cranking by the starter motor 230. The cranking means rotating the crankshaft (not shown) of the engine 130 in order to start the engine.

In FIG. 9A, $\Delta V$ is a voltage change of the total voltage VB of the assembled battery 40 at the time of cranking and is a voltage difference between the voltage immediately before cranking and the minimum voltage at the time of cranking. In FIG. 9B, $\Delta I$ is a current change of the discharge current I of the assembled battery 40 at the time of cranking, and is a current difference between the maximum current at the time of cranking and the current immediately before cranking.

The internal resistance R of the assembled battery 40 can be estimated by Equation 2 below by using $\Delta V$ and $\Delta I$:

$$R = \Delta V / \Delta I \tag{Equation 2}$$

For example, in the case of FIGS. 9A and 9B, the internal resistance R is 3.63 [m$\Omega$](=|12 V·10 V|/|600 A·50 A|).

The processor 70 compares the magnitude of the discharge current I of the battery BT1 with a threshold value with a threshold value to determine whether or not cranking by the starter motor 230 has been performed. At the time of cranking by the starter motor 230, the processor 70 estimates the internal resistance R of the assembled battery 40 by using the first estimation method described above (first estimation processing).

Figure 10:
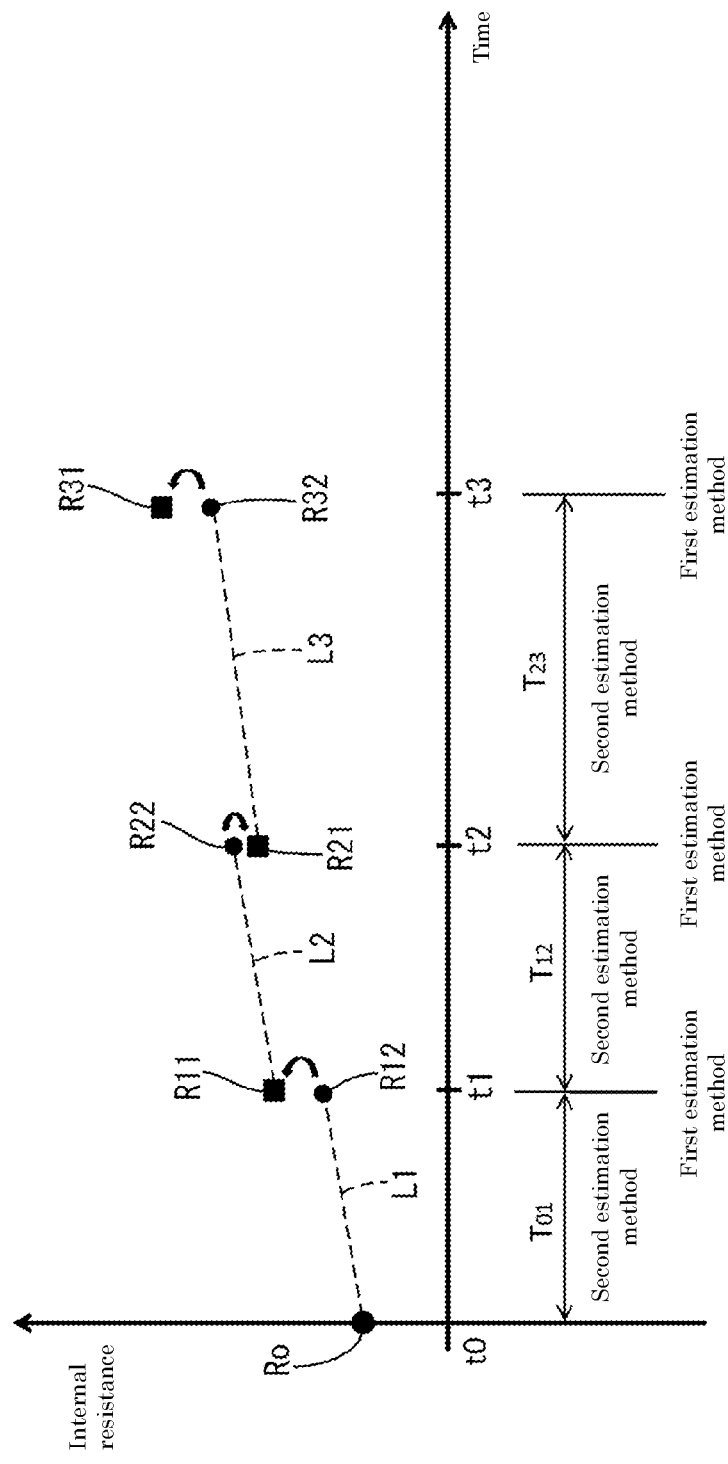
FIG. 10 is a graph showing estimation results of internal resistance.

FIG. 10 is a diagram showing the time change of the internal resistance R of the assembled battery 40, time to is the battery manufacturing time, and each of times t1, t2, t3 is the time of cranking by the starter motor 230. R11, R21, and R31 are the internal resistance R of the assembled battery 40 estimated by the first estimation method.

Ro is the initial value of the internal resistance R. In general, the internal resistance R has a resistance component (ohmic resistance) of the battery structure and a resistance component (reaction resistance) due to the speed limit of chemical reactions, and there is a difference among individual batteries. The initial value of the internal resistance R is actually measured for a plurality of assembled batteries 40, and the average value thereof is set as the initial value Ro of the internal resistance R. The initial value Ro is stored into the memory 73 in the battery manufacturing process.

The second estimation method is a method in which the internal resistance R is estimated using the correlation between the capacity decrease rate Xc and the resistance increase rate Zr. The capacity decrease rate Xc is defined by Equation 3 below, and the resistance increase rate Zr of the internal resistance R is defined by Equation 4 below:

$$Xc = \Delta C / C \times 100 \tag{Equation 3}$$

$\Delta C$ is a decrease amount of an actual capacity C.

The actual capacity C is a capacity that can be taken out from the fully charged state of the assembled battery.

$$Zr = \Delta R / R \times 100 \tag{Equation 4}$$

$\Delta R$ is an increase amount of the internal resistance R.

Figure 11:
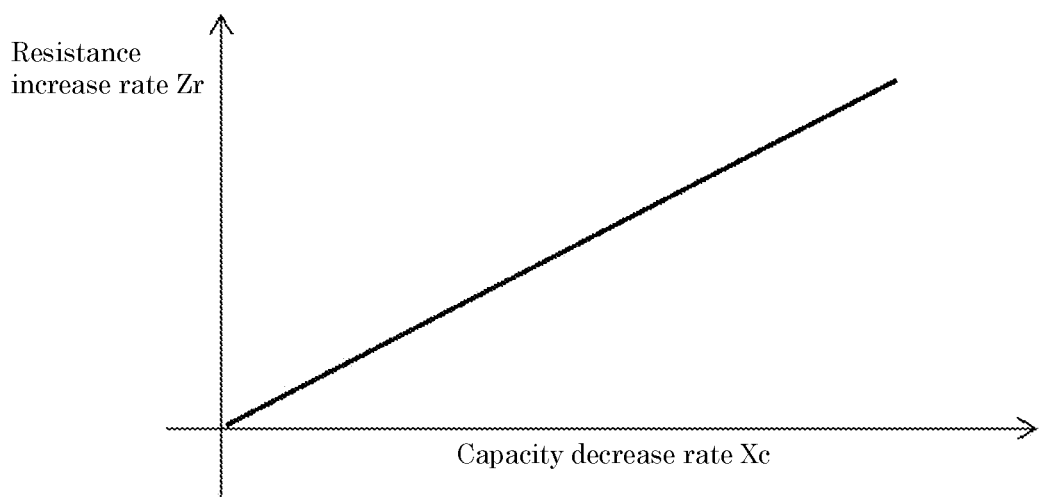
FIG. 11 is a graph showing a relationship between a capacity decrease rate and an increase rate of internal resistance.

FIG. 11 is a graph showing the correlation between the capacity decrease rate Xc and the resistance increase rate Zr. The resistance increase rate Zr can be obtained from the data of the capacity decrease rate Xc by using the correlation data of FIG. 11 (Equation 5). Therefore, when the resistance increase rate after the lapse of a certain period is Zr for the assembled battery 40 having the internal resistance Ra, the resistance increase amount $\Delta R$ is obtained from the resistance increase rate Zr and added to the internal resistance Ra, whereby the internal resistance R after the lapse of the period can be obtained (Equations 6 and 7). The estimation method for the capacity decrease rate Xc will be described later.

$$Zr = K \times Xc \tag{Equation 5}$$

$$\Delta R = Ra \times Zr / 100 \tag{Equation 6}$$

$$R = Ra + \Delta R \tag{Equation 7}$$

K is a proportional constant indicating the correlation between the capacity decrease rate Xc and the resistance increase rate Zr.

In period $T_{01}$ from the battery manufacturing to the first cranking, the processor 70 calculates the capacity decrease rate Xc for each time point after time point to with the actual capacity C at time point to as a reference. The processor 70 calculates the resistance increase rate Zr at each time point from the capacity decrease rate Xc at each time point (Equation 5). The processor 70 calculates the resistance increase amount $\Delta R$ from internal resistance Ro at time point to, from the resistance increase rate Zr at each time point (Equation 6). The processor 70 adds the resistance increase amount $\Delta R$ at each time point to the internal resistance Ro at time point to to calculate the internal resistance R at each time point in period $T_{01}$ (Equation 7). A broken line L1 shown in FIG. 10 is an estimated value of internal resistance Rt estimated by the second estimation method for period $T_{01}$.

In period $T_{12}$ from the first cranking to the second cranking, the processor 70 calculates the capacity decrease rate Xc for each time point t after time point t1 with the actual capacity C at time point t1 as a reference. The processor 70 calculates the resistance increase rate Zr at each time point t after time t1 from the capacity decrease rate Xc at each time point t after time t1 (Equation 5). The processor 70 calculates the resistance increase amount ΔR from internal resistance R11 at each time point t after time t1 from the resistance increase rate Zr at each time point t after time t1 (Equation 6). The processor 70 adds the resistance increase amount ΔR at each time point t after time t1 to the internal resistance R11 at time t1 to calculate the internal resistance R at each time point in period $T_{12}$ (Equation 7). A broken line L2 shown in FIG. 10 is an estimated value of the internal resistance Rt estimated by the second estimation method for period $T_{12}$.

In period $T_{23}$ from the second cranking to the third cranking, the processor 70 calculates the capacity decrease rate Xc for each time point t after time point t2 with the actual capacity C at time point t2 as a reference. The processor 70 calculates the resistance increase rate Zr at each time point t after time t2 from the capacity decrease rate Xc at each time point t after time t2 (Equation 5). The processor 70 calculates the resistance increase amount ΔR from internal resistance R21 at each time point t after time t2 from the resistance increase rate Zr at each time point t after time t2 (Equation 6). The processor 70 adds the resistance increase amount ΔR at each time point t after time t2 to the internal resistance R21 at time t2 to calculate the internal resistance R at each time point in period $T_{23}$ (Equation 7). A broken line L3 shown in FIG. 10 is an estimated value of the internal resistance Rt estimated by the second estimation method for period $T_{23}$.

As described above, the processor 70 estimates the internal resistance R of the assembled battery 40 by the second estimation method in period $T_{01}$ from the time t0 to the first cranking by the starter motor 230 and the periods $T_{12}$ and $T_{23}$ from the cranking by the starter motor 230 to the next cranking (second estimation processing).

Next, a method for estimating the actual capacity C of the secondary battery 2 and a method for calculating the capacity decrease rate Xc will be described.

Figure 12:
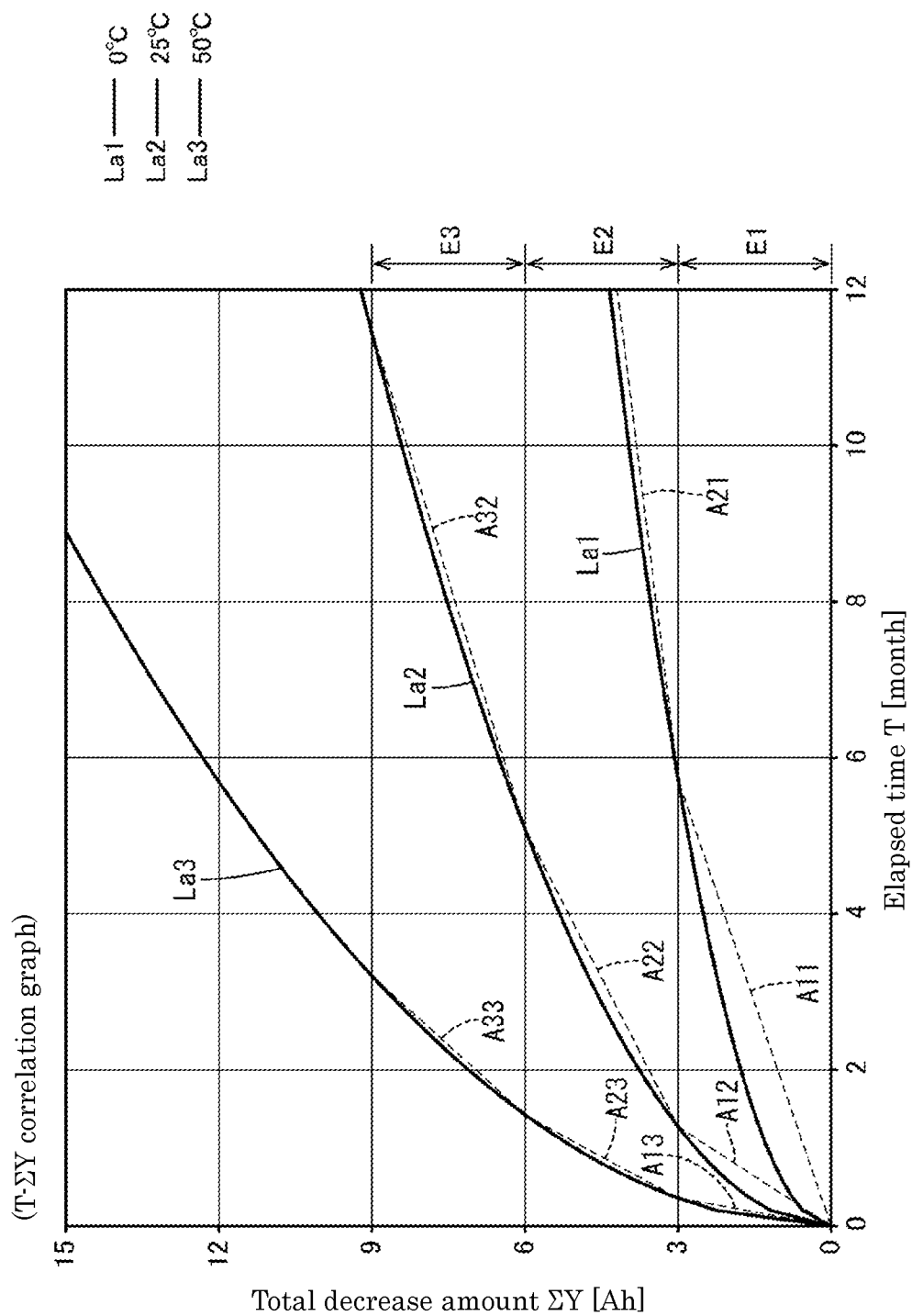
FIG. 12 is a graph showing a capacity change curve of the secondary battery.

FIG. 12 is a T-ΣY correlation graph showing the relationship between the elapsed time T from the battery manufacturing and the total decrease amount ΣY of the actual capacity C for the secondary battery 2. In FIG. 12, the horizontal axis (X-axis) indicates the elapsed time T, and the vertical axis (Y-axis) indicates the total decrease amount ΣY of the actual capacity C. La is a capacity change curve of the secondary battery 2 and a route curve with respect to the elapsed time T.

In FIG. 12, the horizontal axis represents the elapsed time T, but alternatively, in addition to the capacity degradation due to the elapsed time (calendar degradation), degradation due to energization (cycle degradation) may be considered.

A capacity change curve La is set for each battery temperature. La1 is a capacity change curve with a battery temperature of 0 [° C.], La2 is a capacity change curve with a battery temperature of 25 [° C.], and La3 is a capacity change curve with a battery temperature of 50 [C].

The capacity change curves La1 to La3 are obtained by conducting, after the manufacturing of the secondary battery 2, experiments for examining the transition of the total decrease amount ΣY of the actual capacity C of the battery at each battery temperature.

Straight lines A11, A21, A31 are approximate straight lines of the capacity change curve La1, straight lines A12, A22, A32 are approximate straight lines of the capacity change curve La2, and straight lines A13, A23, A33 are approximate straight lines of the capacity change curve La3.

These approximate straight lines divide the vertical axis into three areas E1 to E3 in units of 3 [Ah] to approximate the capacity change curves La1 to La3.

The slope of each of straight lines A1 to A3 approximating the capacity change curve La indicates a decrease amount Y of the actual capacity C per unit time (e.g., per month). In the present embodiment, the magnitude of the slope of each of straight lines A11 to A33 approximating the capacity change curves La1 to La3 is obtained, and the obtained result is converted into data as the capacity decrease amount map MA of the secondary battery 2.

Figure 13:
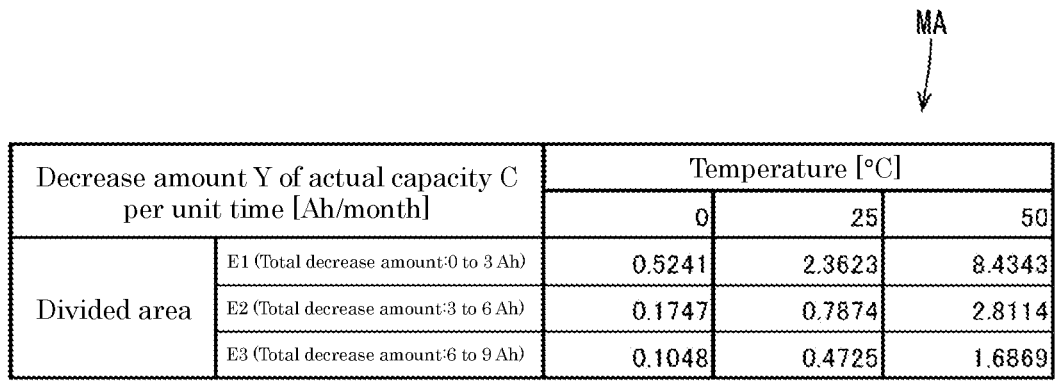
FIG. 13 is a diagram showing a capacity decrease amount map MA.

As shown in FIG. 13, the capacity decrease amount map MA is obtained by calculating the decrease amount Y of the actual capacity C per unit time for each battery temperature and each of the areas E1 to E3 dividing the capacity change curve La. The data of the capacity decrease amount map MA shown in FIG. 13 is previously held in the memory 73.

Figure 14:
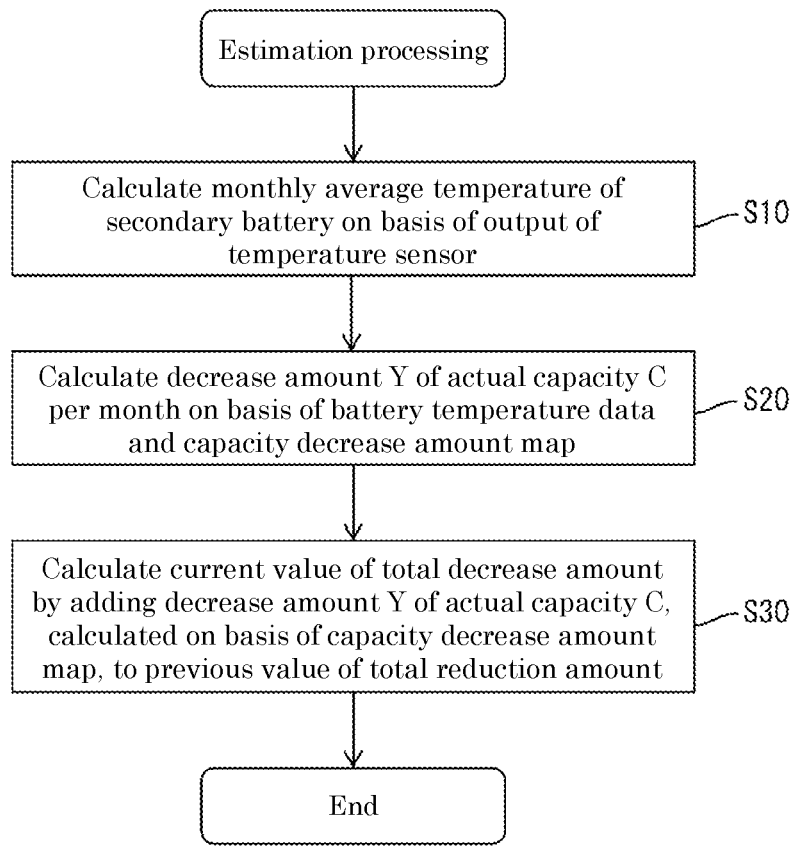
FIG. 14 is a flowchart of estimation processing for a total decrease amount of an actual capacity of the secondary battery.

FIG. 14 is a flowchart of the estimation processing for the total decrease amount ΣY of the actual capacity C of the secondary battery 2. As shown in FIG. 14, the estimation processing for the total decrease amount ΣY is made up of the processing of S10 to S30. The processor 70 calculates the average temperature per unit time of the secondary battery 2 on the basis of the output of the temperature sensor 42 every time the unit time (e.g., one month) elapses after the manufacturing of the battery (S10).

Next, the processor 70 calculates the decrease amount Y of the actual capacity C of the secondary battery 2 per unit time on the basis of the battery temperature data and the capacity decrease amount map MA (S20).

Thereafter, the processor 70 adds the calculated decrease amount Y of the actual capacity C per unit time to a previous value of the total decrease amount ΣY to calculate the current value of the total decrease amount ΣY (S30).

As shown in FIG. 15, in a case where the average temperature in the first month after the manufacturing of the battery is 0 [° C.], the decrease amount of the actual capacity C per month is 0.5241 [Ah/month], and the total decrease amount ΣY of the actual capacity C at the time point when one month has elapsed since the manufacturing of the battery is 0.5241 [Ah] as shown in FIG. 15.

In a case where the total decrease amount ΣY of the actual capacity C at the time point when one month has elapsed since the manufacturing of the battery is 0.5241 [Ah], the division of the total decrease amount ΣY of the secondary battery 2 is included in the area E1 (0 to 3 [Ah]). Therefore, for the period until the lapse of one to two months after the manufacturing of the battery, the decrease amount of the actual capacity C per month is any of 0.5241 [Ah/month], 2.3623 [Ah/month], and 8.4343 [Ah/month].

When the average temperature in the second month after the manufacturing of the battery is 25 [° C.], the decrease amount of the actual capacity C in the second month after the manufacturing of the battery is 2.3623 [Ah/month]. The total decrease amount ΣY of the actual capacity C at the time point when two months have elapsed since the manufacturing of the battery is a numerical value obtained by adding the decrease amount Y of the actual capacity C in the second month to the total decrease amount ΣY of the actual capacity C at the time point when one month has elapsed since the manufacturing of the battery, that is, 0.5241 [Ah]+2.3623 [Ah], which is 2.8864 [Ah] as shown in FIG. 15.

In a case where the total decrease amount ΣY of the actual capacity C at the time point when two months have elapsed since the manufacturing of the battery is 2.8864 [Ah], the division of the total decrease amount ΣY of the secondary battery 2 is included in the area E1 (0 to 3 [Ah]). Therefore, for the period until the lapse of two to three months after the manufacturing of the battery, the decrease amount of the actual capacity C per month is any of 0.5241 [Ah/month], 2.3623 [Ah/month], and 8.4343 [Ah/month].

As shown in FIG. 15, when the average temperature in the third month after the manufacturing of the battery is 25 [° C.], the decrease amount Y of the actual capacity C per month in the third month after the manufacturing of the battery is 2.3623 [Ah/month].

The total decrease amount ΣY of the actual capacity C at the time point when three months have elapsed since the manufacturing of the battery is a numerical value obtained by adding the decrease amount Y of the actual capacity C in the third month to the total decrease amount ΣY of the actual capacity C at the time point when two months have elapsed since the manufacturing of the battery, that is, 2.8864 [Ah]+2.3623 [Ah], which is 5.2487 [Ah] as shown in FIG. 15.

When the total decrease amount ΣY of the actual capacity C is 5.2487 [Ah], the division of the total decrease amount ΣY of the secondary battery 2 is included in the area E2 (3 to 6 [Ah]). Therefore, for the period until the lapse of three to four months after the manufacturing of the battery, the decrease amount of the actual capacity C per month is any of 0.1747 [Ah/month], 0.7874 [Ah/month], and 2.8114 [Ah/month]

As shown in FIG. 15, when the average temperature in the fourth month after the manufacturing of the battery is 25 [° C.], the decrease amount Y of the actual capacity C per month in the fourth month after the manufacturing of the battery is 0.7874 [Ah/month]. Therefore, the total decrease amount ΣY of the actual capacity C at the time point when four months have elapsed since the manufacturing of the battery is a numerical value obtained by adding the decrease amount Y of the actual capacity C in the fourth month to the total decrease amount ΣY of the actual capacity C at the time point when three months have elapsed since the manufacturing of the battery, that is, 5.2487 [Ah]+0.7874 [Ah], which is 6.0361[Ah] as shown in FIG. 15.

As described above, the current value of the total decrease amount ΣY of the actual capacity C can be obtained by adding the decrease amount of the actual capacity C per month obtained from the capacity decrease amount map MA to the total decrease amount ΣY up to the previous month. As described above, the current value of the actual capacity C can be obtained from Equation 8 below on the basis of an initial value Co of the actual capacity C and the total decrease amount ΣY of the actual capacity C:

$$C = Co \cdot \Sigma Y \qquad \text{(Equation 8)}$$

Co is the initial value of the actual capacity C of the secondary battery 2, and C is the current value of the actual capacity.

The processor 70 estimates the actual capacity C of the secondary battery 2 at intervals of the unit time (e.g., one month) after the manufacturing of the battery and stores the resulting data into the memory 73. The capacity decrease rate Xc of the secondary battery 2 can be obtained from the estimated value of the actual capacity C at each time point, which is stored in the memory 73. For example, when the actual capacity at time point ta is Ca and the actual capacity at time point tb after the lapse of the unit time from time point ta is Cb, the capacity decrease rate Xc of time point tb is expressed by Equation (9) below:

$$Xc = (Ca \cdot Cb)/Ca \times 100 \qquad \text{(Equation 9)}$$

The assembled battery 40 is formed by connecting a plurality of secondary batteries 2 in series, and when there is no variation in the capacity decrease rate Xc among the secondary batteries, it can be considered that the capacity decrease rate Xc of the secondary batteries 2 is equal to the capacity decrease rate Xc of the assembled battery 40. In this manner, it is possible to obtain the data of the capacity decrease rate Xc of the assembled battery 40 to be used for estimating the internal resistance R.

In the above example, the interval (unit time) at which the estimation processing for the actual capacity C is performed is set to one month. The interval at which the estimation processing for the actual capacity C is performed may be set to one day or one hour. In this case, the decrease amount Y of the actual capacity C per day or per hour may be obtained from the slope of each of the approximate straight lines A11 to A33, and the data may be stored into the capacity decrease amount map MA shown in FIG. 13. By setting the interval at which the estimation processing for the actual capacity C is performed to one day or one hour, the interval for the estimation of the internal resistance R by the second estimation method can be shortened, thereby improving the estimation accuracy of the internal resistance R.

5. Description of Effects

Period T from the cranking by the starter motor 230 to the next cranking is an estimation-impossible period in which the internal resistance R cannot be estimated by the first estimation method. The processor 70 estimates the internal resistance R by the second estimation method in period T from the cranking to the next cranking. Therefore, the internal resistance R can be estimated even during the impossible period for the estimation by the first estimation method, and the estimation accuracy of the internal resistance R is high.

This is especially effective for the hybrid vehicle VH because the frequency of cranking by the starter motor 230 is low, and the impossible period for the estimation by the first estimation method may be long.

The reason why the frequency of cranking by the starter motor 230 is low is that the hybrid vehicle VH can travel only by the power of the drive motor 120 depending on the traveling state such as the start of traveling, and hence the engine 130 may stop and not be used even during traveling. Also, the reason is that in the hybrid vehicle VH the engine 130 may be able to be cranked by using the drive motor 120 or the generator 160 as a starting motor in addition to the starter motor 230. The cranking by the starter motor 230 may be performed at a low temperature when the ambient temperature is low or during maintenance.

In the second estimation method, the processor 70 obtains the resistance increase amount ΔR from the internal resistance R estimated by the first estimation method to estimate the internal resistance R in the period until the next cranking. With the first estimation method having the high estimation accuracy of the internal resistance R, the estimation error of the internal resistance R at the start point of estimation by the second estimation method is small. Hence the internal resistance R can be estimated with high accuracy by the second estimation method in the period until the next cranking Second Embodiment In the first embodiment, the determination has not been made as to whether or not the estimated value of the internal resistance R estimated by the first estimation method is a good value, but upon the estimation of the internal resistance R by the first estimation method, the resistance increase amount ΔR from the estimated internal resistance R has been obtained to estimate the internal resistance R in the period until the next cranking. For example, in FIG. 10, the internal resistance R21 has been estimated by the first estimation method at the second cranking time t2, and the resistance increase amount ΔR has then been obtained from the internal resistance R21 estimated by the first estimation method to estimate the internal resistance R in period $T_{23}$ until the next cranking.

In a second embodiment, the estimated value of the internal resistance R obtained by the first estimation method is compared with a fluctuation range Q, and when the estimated value of the internal resistance R is not included in the fluctuation range Q, the estimated value of the internal resistance R is limited within the range of the fluctuation range Q, and the resistance increase amount ΔR from the limited internal resistance R is obtained to estimate the internal resistance R in the period until the next cranking. The fluctuation range Q is an estimated fluctuation range of the internal resistance R during the impossible period for the estimation by the first estimation method (the period from the cranking to the next cranking).

Figure 16:
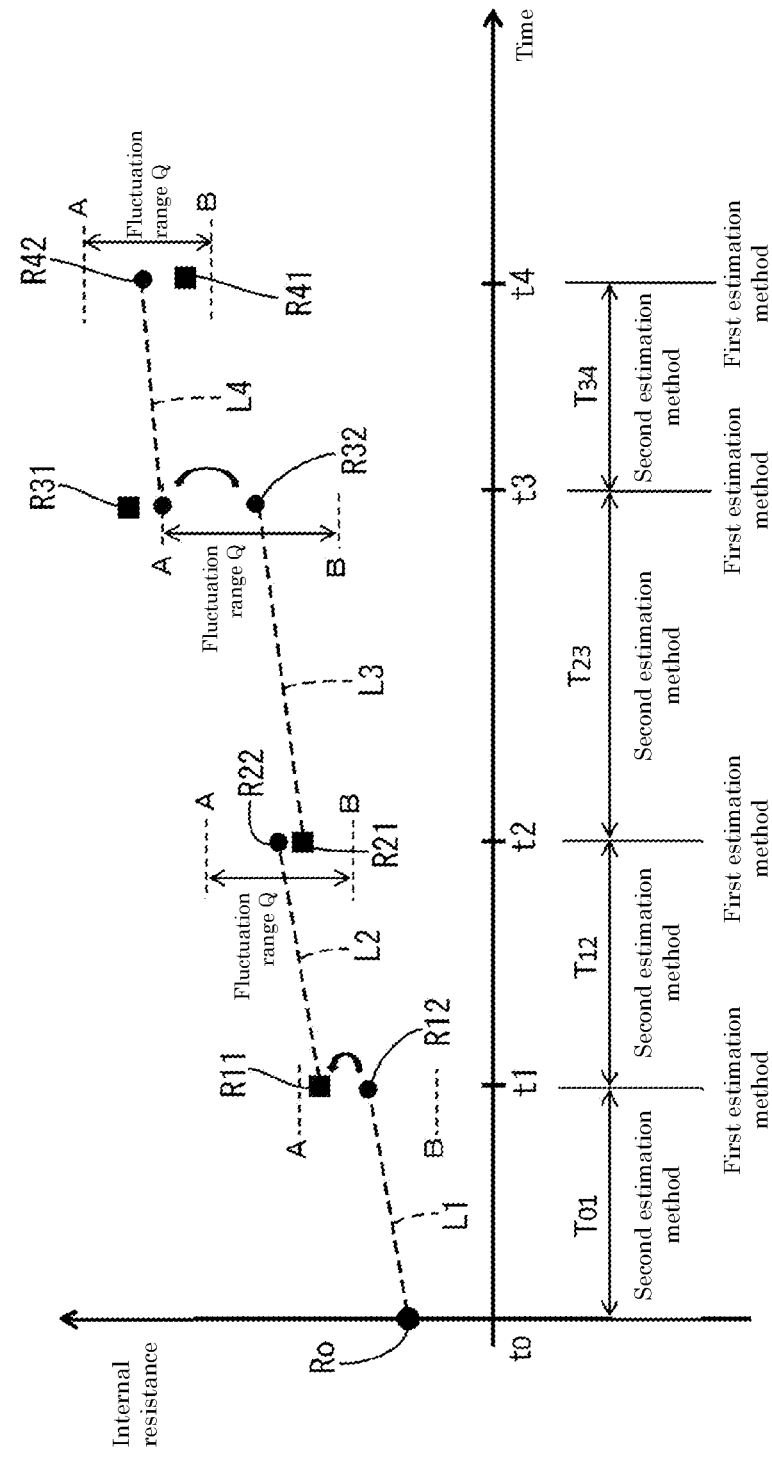
FIG. 16 is a graph showing estimation results of internal resistance in a second embodiment.
Figure 17:
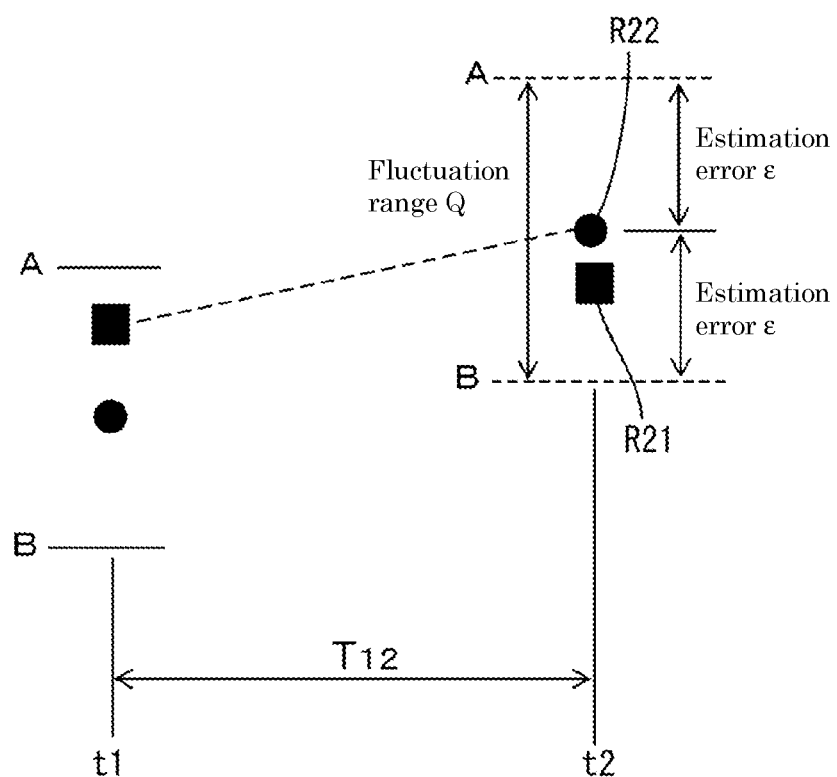
FIG. 17 is an explanatory diagram of a fluctuation range.

As shown in FIG. 17, the fluctuation range Q can be set from an estimation error & of the internal resistance R by the second estimation method with the estimated value of the internal resistance R, obtained by the second estimation method, as the median. For example, the fluctuation range Q at time point t2 can be set from the estimation error & of the internal resistance R by the second estimation method during period $T_{12}$ with the estimated value R22 of the internal resistance R, obtained by the second estimation method at time point t2, as the median. The estimation error & is, for example, an error due to the temperature measurement error of the secondary battery 2 or the approximation of the capacity change curve La. "A" in each of FIGS. 16 and 17 indicates the upper limit value of the fluctuation range Q, and "B" indicates the lower limit value thereof.

Figure 18:
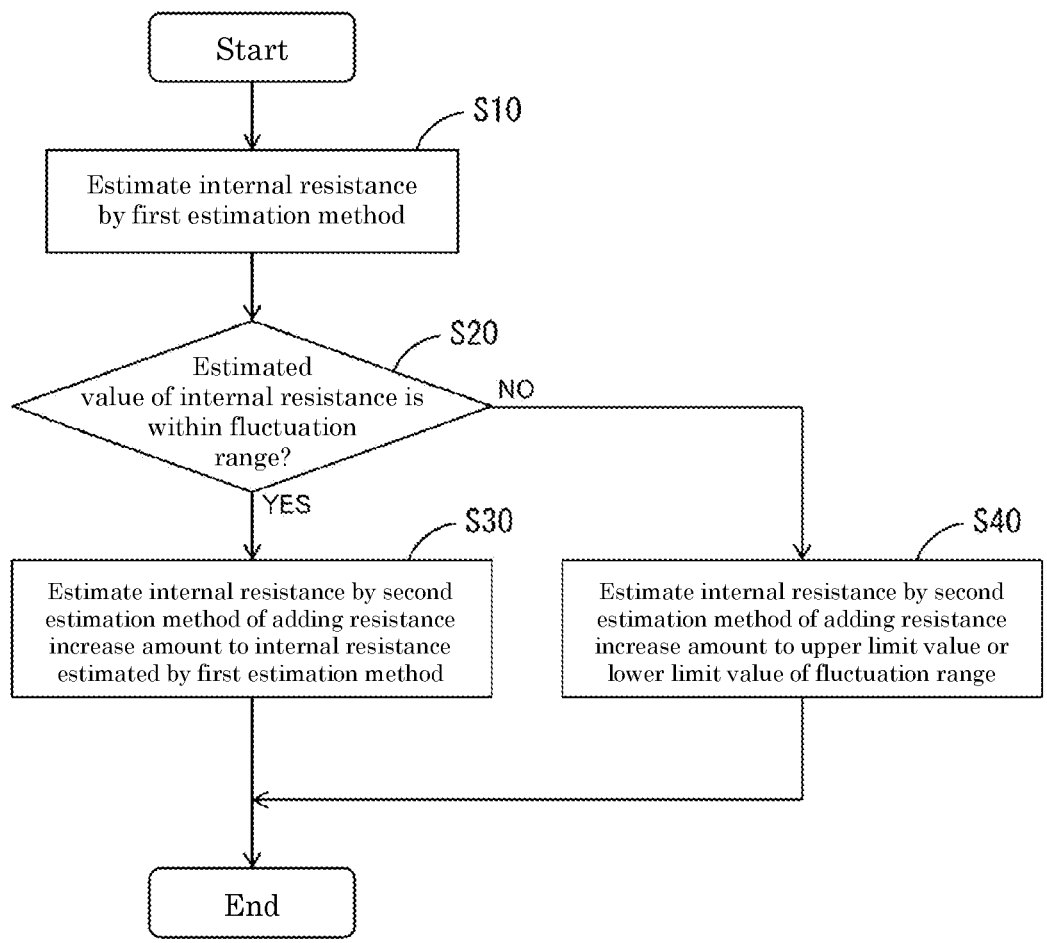
FIG. 18 is a flowchart of estimation processing for internal resistance.

FIG. 18 is a flowchart of the estimation processing for the internal resistance. The estimation processing for the internal resistance R of the assembled battery 40 is made up of four steps S10 to S40. In S10, the processor 70 estimates the internal resistance R of the assembled battery 40 by the first estimation method. In S20, the processor 70 determines whether the estimated value of the internal resistance R obtained by the first estimation method is within the range of the fluctuation range Q.

When the estimated value of the internal resistance R is included in the fluctuation range Q (S20: YES), the processing shifts to S30, and the processor 70 calculates the resistance increase amount ΔR from the internal resistance R estimated by the first estimation method. The processor 70 then adds the calculated resistance increase amount ΔR to the internal resistance R estimated by the first estimation method to estimate the internal resistance R On the other hand, when the estimated value of the internal resistance R is not included in the fluctuation range Q (S20: NO), the processing shifts to S40. Upon shifting to S40, the processor 70 limits the internal resistance R estimated by the first estimation method within the range of the fluctuation range Q and calculates the resistance increase amount ΔR from the upper limit value A or the lower limit value B of the fluctuation range Q. The processor 70 adds the resistance increase amount ΔR to the upper limit value A or the lower limit value B of the fluctuation range Q to estimate the internal resistance R of the assembled battery 40.

At the first and second cranking times t1 and t2 shown in FIG. 16, the pieces of internal resistance R11, R21 estimated by the first estimation method are both included in the fluctuation range Q. Therefore, in period $T_{12}$ from the first cranking to the second cranking and period $T_{23}$ from the second cranking to the third cranking, the resistance increase amount ΔR is added to the pieces of internal resistance R11, R21 estimated by the first estimation method to estimate the internal resistance R of the assembled battery 40.

On the other hand, at the third cranking time t3 shown in FIG. 16, internal resistance R31 estimated by the first estimation method is not included in the fluctuation range Q and deviates to the upper limit value A side. Thus, at the third cranking time t3, the internal resistance R31 estimated by the first estimation method is limited to the upper limit value A of the fluctuation range Q. In period $T_{34}$ from the third cranking to the fourth cranking, the resistance increase amount ΔR is added to the upper limit value A of the fluctuation range Q to estimate the internal resistance R of the assembled battery 40. When the internal resistance R31 estimated by the first estimation method deviates to the lower limit value B side, the internal resistance R31 estimated by the first estimation method may be limited to the lower limit value B of the fluctuation range Q at the third cranking time t3, and the resistance increase amount ΔR may be added to the lower limit value B of the fluctuation range Q, thereby estimating the internal resistance R.

The fluctuation range Q for determining whether or not the estimated value of the internal resistance R is a good value varies depending on the length of the estimation period T in the second estimation method, and the is larger as the estimation period T is longer.

In the example shown in FIG. 16, since the estimation is longer in the order of the fourth estimation period $T_{34}$, the first estimation period $T_{01}$, the second estimation period $T_{12}$, and the third estimation period $T_{23}$, the fluctuation range Q is wider in the order of the fourth cranking time t4, the first cranking time t1, the second cranking time t2, and the third cranking time t3. This is because the accumulation of estimation errors by the second estimation method is considered.

In the second embodiment, the processor 70 compares the estimated value of the internal resistance R obtained by the first estimation method with the fluctuation range Q. When the estimated value is not included in the fluctuation range Q, the processor 70 limits the internal resistance R estimated by the first estimation method to the upper limit value A or the lower limit value B of the fluctuation range Q. Thus, the estimated value of the internal resistance R can be prevented from fluctuating abnormally, and the estimation accuracy of the internal resistance R increases.

When the internal resistance, which generally makes no sudden change, has abnormally increased or decreased as a result of the estimation by the first estimation method, the increase or decrease is likely to be an estimation error of the internal resistance R by the first estimation method. When the cranking is frequently performed, the influence of the estimation error can be reduced by using the average value of several times. However, when the frequency of cranking is low, it is difficult to use the average value of several times. In this method, even when the frequency of cranking is low, and the average-value processing for estimation results cannot be performed, it is possible to prevent the estimated value of the internal resistance R from fluctuating abnormally.

Third Embodiment

Figure 19:
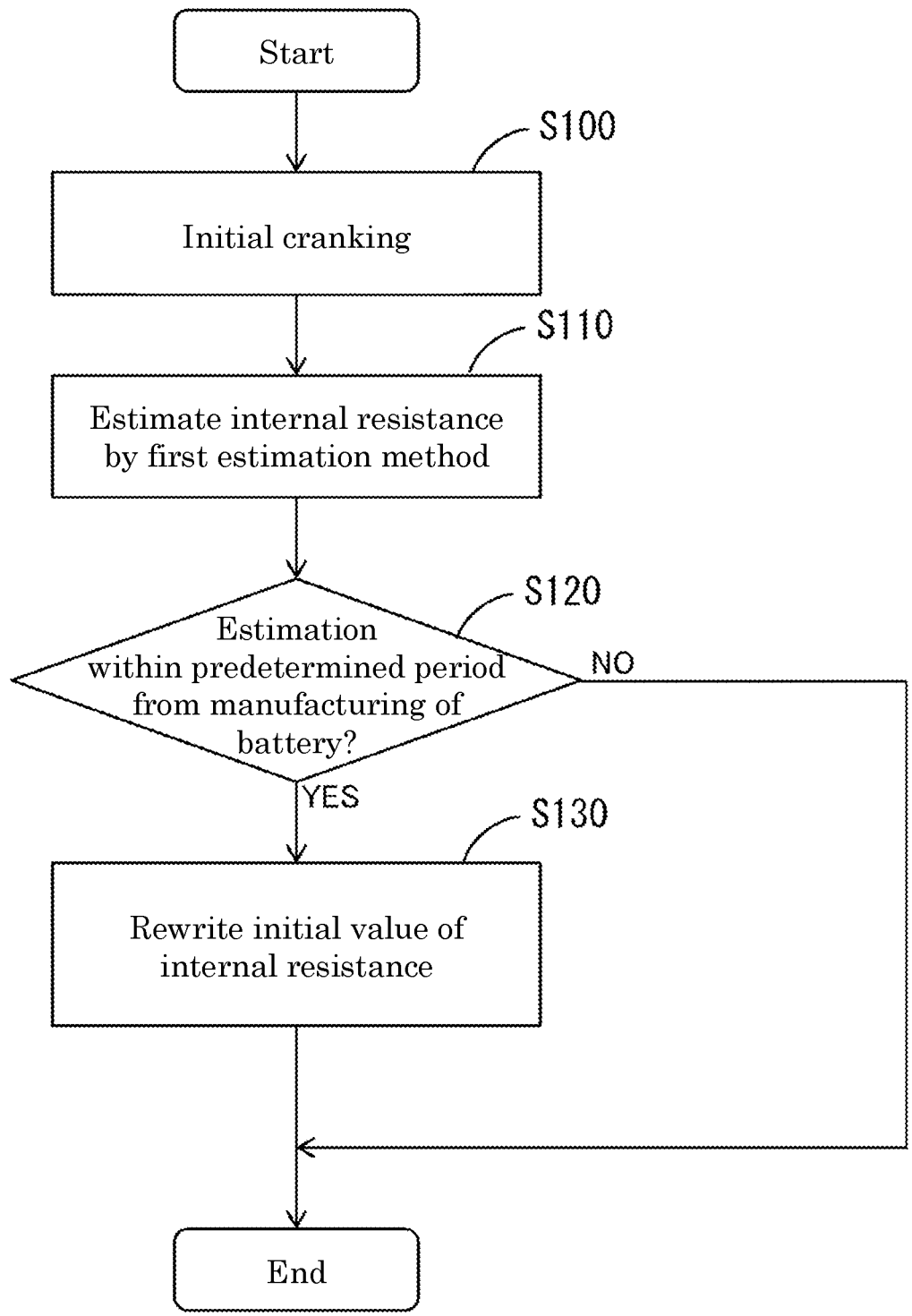
FIG. 19 is a flowchart showing rewriting processing for an initial value of internal resistance in a third embodiment.

In a third embodiment, rewriting processing for the initial value Ro of the internal resistance R of the assembled battery 40 is added. FIG. 19 is a flowchart of the rewriting processing for the initial value Ro of the internal resistance R. The rewriting processing for the initial value Ro is made up of S100 to S130. The rewriting processing for the initial value Ro is performed in parallel with the estimation processing for the internal resistance R. After the manufacturing of the battery, the processor 70 estimates the internal resistance R of the assembled battery 40 by the second estimation method. When the first cranking is performed, the processor 70 estimates the internal resistance R of the assembled battery 40 by the first estimation method (S100, S110).

Next, the processor 70 determines whether the estimation of the internal resistance R by the first estimation method is performed within a predetermined period from the battery manufacturing time to (S120). The predetermined period is, for example, three months. When estimating the internal resistance R by the first estimation method within the predetermined period from the battery manufacturing time to, the processor 70 shifts to S130 and rewrites the initial value Ro of the internal resistance R stored in the memory 73. Specifically, the processor 70 rewrites the stored value (the average of the measured internal resistance values of the assembled battery 40) stored at the battery manufacturing time to with the estimated value estimated by the first estimation method at the time of the first cranking. On the other hand, when the estimation is performed after the lapse of the predetermined period from the battery manufacturing time to, the initial value Ro is not rewritten.

The initial value Ro of the internal resistance R varies depending on the individual difference of the assembled battery 40. It is considered that the internal resistance R hardly changes from the initial value Ro so long as within the predetermined period after the manufacturing of the battery. Thus, when the internal resistance R is estimated by the first estimation method within the predetermined period after the manufacturing of the battery, the error of the initial value Ro can be reduced by rewriting the initial value Ro of the internal resistance R from the stored value to the estimated value obtained by the first estimation method. By reducing the error of the initial value Ro, it is possible to accurately obtain the resistance increase amount of the internal resistance R (the resistance increase amount with respect to the initial value Ro).

Other Embodiments

The present invention is not restricted to the embodiments described above and the drawings, but, for example, the following embodiments are included in the technical scope of the present invention.

(1) In the first embodiment, the secondary battery 2 has been shown as an example of the energy storage device. The energy storage device is not restricted to the secondary battery 2 but may be a capacitor. The secondary battery 2 may be a nonaqueous electrolyte secondary battery such as a lithium ion secondary battery or a lead-acid battery. The secondary battery 2 is not restricted to a case where a plurality of batteries are connected in series or in series-parallel, but the secondary battery 2 may be configured to be a single cell (only one secondary battery). In addition, the management apparatus 50 may be provided outside the low-voltage battery BT1 so long as information on the current I, the voltage VB, and the temperature of the assembled battery 40, and the like, can be obtained from measurement instruments such as the current sensor 41, the voltage detection circuit 60, and the temperature sensor 42.

(2) In the first embodiment, as an example of the second estimation method, the resistance increase rate Zr of the battery BT1 has been obtained on the basis of the capacity decrease rate Xc to estimate the internal resistance R of the battery BT1. The information correlated with the resistance increase rate Zr includes temperature T [° C.] of the battery BT1 in addition to the capacity decrease rate Xc. The resistance increase rate Zr may be obtained on the basis of the measured value of the temperature T of the battery BT1 to estimate the internal resistance R of the battery BT1. The second estimation method may be another method so long as being a different method from the first estimation method. For example, the second estimation method may be a method for estimating the internal resistance on the basis of a battery model formed by modeling the behavior of the active materials, ions, and the like of the secondary battery. JP-A-2013-44580 is an estimation method for internal resistance based on a battery model.

(3) In the first embodiment, the average of the measured values has been used as the initial value Ro of the internal resistance R. The initial value Ro of the internal resistance R only need be a value obtained by some method and may be a calculated value or an empirical value in addition to the average of the measured values.

(4) The present technique can be appropriately applied to a hybrid vehicle VH so long as the hybrid vehicle VH includes the drive motor 120 and the engine 130, regardless of the type of the drive apparatus 100 of the vehicle. The present invention is applicable not only to a parallel type or series-parallel type using the engine 130 as the power source of the vehicle but also to a series type using the engine 130 exclusively for power generation. The charging system of the hybrid vehicle may be a plug-in type or a non-plug-in type that can be charged by a commercial power source.

(5) In the first embodiment, the low-voltage battery BT1 is a 12 V system. The low-voltage battery BT1 may be a 24 V system or a 48 V system. The low-voltage battery BT1 as an object of the present invention drives the engine 130 regardless of the voltage class.

(6) In the second embodiment, in the case of the fluctuation range Q not including the estimated value of the internal resistance R obtained by the first estimation method, the estimated value of the internal resistance R has been limited to the upper limit value A or the lower limit value B of the fluctuation range Q. In addition to the upper limit value A and the lower limit value B, the estimated value of the internal resistance R may be limited to another limit value so long as the value is within the range of the fluctuation range Q (the range of upper limit A to lower limit B).

(7) The concept of the present technique can be applied to an estimation program that estimates the internal resistance of an engine starting battery. An estimation program, which estimates internal resistance of an engine starting battery, causes a computer to execute first estimation processing for estimating the internal resistance of the battery by a first estimation method based on a current change and a voltage change of the battery during cranking by an engine starting apparatus, and second estimation processing for estimating the internal resistance of the battery by a second estimation method different from the first estimation method for a period from the cranking by the engine starting apparatus to the next cranking.

(8) The concept of the present technique can be applied to a recording medium in which an estimation program for estimating the internal resistance of an engine starting battery is recorded.

(9) The concept of the present technique can be applied to a low-voltage battery mounted on an electric vehicle (EV) without an engine or an engine starting apparatus, an electric motorcycle, a battery-driven ship, and other moving bodies without an engine.

In an electric vehicle, the internal resistance of the low-voltage battery may be estimated by a method based on the current change and the voltage change of the low-voltage battery at a timing when a current of about 100 amperes flows in the low-voltage battery or at a timing when a current of more than 100 amperes flows in the low-voltage battery (that is, at the time of energization suitable for estimating the internal resistance).

DESCRIPTION OF REFERENCE SIGNS

2: secondary battery (energy storage device)
40: assembled battery
50: management apparatus (estimation apparatus)
60: voltage detection circuit
70: processor
71: CPU
73: memory (storage part)
230: starter motor (engine starting apparatus)
BT1: engine starting low-voltage battery
VH: hybrid vehicle

The invention claimed is:

1. An estimation apparatus for estimating internal resistance of an engine starting battery, the estimation apparatus comprising
 a processor that executes
  first estimation processing for estimating the internal resistance of the battery by a first estimation method based on a current change and a voltage change of the battery at a time of cranking by an engine starting apparatus,
  second estimation processing for estimating the internal resistance of the battery by a second estimation method different from the first estimation method in a period from the cranking by the engine starting apparatus to a next cranking, and
  determining whether the internal resistance estimated by the first estimation method is good or not by comparing the internal resistance with a fluctuation range,
 wherein when the internal resistance estimated by the first estimation method is within the fluctuation range, the processor executes the second estimation processing of adding resistance increase amount to the internal resistance estimated by first estimation method.

2. The estimation apparatus according to claim 1, wherein the processor executes the second estimation processing at a plurality of time points in the period from the cranking by the engine starting apparatus to the next cranking.

3. The estimation apparatus according to claim 1, wherein
 the processor includes a storage part storing an initial value of the internal resistance, and
 when estimating the internal resistance by the first estimation method within a predetermined period after manufacturing of the battery, the processor rewrites the initial value of the internal resistance from the stored initial value to an estimated value obtained by the first estimation method.

4. The estimation apparatus according to claim 1, wherein the second estimation method is a method for estimating the internal resistance of the battery on a basis of information correlated with a resistance increase rate of the internal resistance.

5. The estimation apparatus according to claim 4, wherein in the second estimation method, the processor obtains, from the resistance increase rate, an amount of increase in resistance from the internal resistance estimated by the first estimation method at the time of cranking by the engine starting apparatus to estimate the internal resistance in a period until the next cranking.

6. The estimation apparatus according to claim 1, wherein in the second estimation method, when the internal resistance estimated by the first estimation method is not included in a fluctuation range at a time of cranking by the engine starting apparatus, the processor limits the internal resistance estimated by the first estimation method within the fluctuation range.

7. The estimation apparatus according to claim 6, wherein the fluctuation range is larger as the period from the cranking by the engine starting apparatus to the next cranking is longer.

8. An engine starting battery, comprising:
 one or a plurality of energy storage devices; and
 the estimation apparatus according to claim 1.

9. A vehicle comprising:
 a drive motor;
 an engine;
 an engine starting apparatus that starts the engine; and
 the engine starting battery according to claim 8.

10. The vehicle according to claim 9, comprising an electric vehicle (EV) priority button that prioritizes an EV traveling mode.

11. The estimation apparatus according to claim 1, wherein the determining whether the internal resistance estimated by the first estimation method is good or not comprises determining whether the internal resistance estimated by the first estimation method is an acceptable value by comparing the internal resistance with the fluctuation range.

12. The estimation apparatus according to claim 1, wherein the determining whether the internal resistance estimated by the first estimation method is good or not comprises determining whether the internal resistance estimated by the first estimation method is within the fluctuation range.

13. The estimation apparatus according to claim 1, wherein when the internal resistance estimated by the first estimation method is outside the fluctuation range, the processor executes the second estimation processing of adding the resistance increase amount to upper limit value or lower limit value of the fluctuation range.

14. An estimation apparatus for estimating internal resistance of an engine starting battery, the apparatus comprising
 a processor that executes
  first estimation processing for estimating the internal resistance of the battery by a first estimation method based on a current change and a voltage change of the battery at a time of cranking by an engine starting apparatus, and
  second estimation processing for estimating the internal resistance of the battery by a second estimation method different from the first estimation method in a period from the cranking by the engine starting apparatus to the next cranking,
 wherein in the second estimation method, when the internal resistance estimated by the first estimation method is not included in a fluctuation range at a time of cranking by the engine starting apparatus, the processor limits the internal resistance estimated by the first estimation method within the fluctuation range, and wherein when the internal resistance estimated by the first estimation method is larger than an upper limit value of the fluctuation range, the processor obtains an amount of increase in resistance from the upper limit value of the fluctuation range to estimate the internal resistance in a period until the next cranking, and when the internal resistance estimated by the first estimation method is smaller than a lower limit value of the fluctuation range, the processor obtains an amount of increase in resistance from the lower limit value of the fluctuation range to estimate the internal resistance in the period until the next cranking.

15. An estimation method for estimating internal resistance of an engine starting battery, the method comprising
estimating the internal resistance of the battery by a first estimation method based on a current change and a voltage change at a time of cranking by an engine starting apparatus,
estimating the internal resistance of the battery by a second estimation method different from the first estimation method for a period from the cranking by the engine starting apparatus to the next cranking, and
determining whether the internal resistance estimated by the first estimation method is good or not by comparing the internal resistance with a fluctuation range,
wherein when the internal resistance estimated by the first estimation method is within the fluctuation range, the processor executes the second estimation processing of adding resistance increase amount to the internal resistance estimated by first estimation method.

16. An estimation apparatus that estimates internal resistance of a low-voltage battery, the apparatus comprising
a processor that executes
first estimation processing for estimating the internal resistance of the battery by a first estimation method based on a current change and a voltage change of the battery at a time of energization suitable for estimating the internal resistance,
second estimation processing for estimating the internal resistance of the battery by a second estimation method different from the first estimation method for a period from the energization suitable for estimating the internal resistance to the next energization suitable for estimating the internal resistance, and
determining whether the internal resistance estimated by the first estimation method is good or not by comparing the internal resistance with a fluctuation range,
wherein when the internal resistance estimated by the first estimation method is within the fluctuation range, the processor executes the second estimation processing of adding resistance increase amount to the internal resistance estimated by first estimation method.

17. The estimation apparatus according to claim 16, wherein the processor executes the second estimation processing at a plurality of time points in the period from the energization suitable for estimating the internal resistance to the next energization suitable for estimating the internal resistance.

18. A low-voltage battery comprising:
one or a plurality of energy storage devices; and
the estimation apparatus according to claim 16.

19. An estimation method for estimating internal resistance of a low-voltage battery, the method comprising:
estimating the internal resistance of the battery by a first estimation method based on a current change and a voltage change at a time of energization suitable for estimating the internal resistance,
estimating the internal resistance of the battery by a second estimation method different from the first estimation method for a period from the energization suitable for estimating the internal resistance to the next energization suitable for estimating the internal resistance, and
determining whether the internal resistance estimated by the first estimation method is good or not by comparing the internal resistance with a fluctuation range,
wherein when the internal resistance estimated by the first estimation method is within the fluctuation range, the processor executes the second estimation processing of adding resistance increase amount to the internal resistance estimated by first estimation method.

* * * * *